(12) United States Patent
Choi et al.

(10) Patent No.: US 11,342,310 B2
(45) Date of Patent: May 24, 2022

(54) SEMICONDUCTOR CHIP, SEMICONDUCTOR DEVICE, AND SEMICONDUCTOR PACKAGE INCLUDING THE SEMICONDUCTOR CHIP

(71) Applicant: Samsung Electronics Co., Ltd., Suwon-si (KR)

(72) Inventors: Yongwon Choi, Seoul (KR); Wonkeun Kim, Hwaseong-si (KR); Inyoung Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/172,478

(22) Filed: Feb. 10, 2021

(65) Prior Publication Data

US 2021/0384162 A1 Dec. 9, 2021

(30) Foreign Application Priority Data

Jun. 8, 2020 (KR) .................. 10-2020-0069093

(51) Int. Cl.
*H01L 23/00* (2006.01)
*H01L 25/065* (2006.01)
*H01L 25/00* (2006.01)

(52) U.S. Cl.
CPC .......... *H01L 25/0657* (2013.01); *H01L 24/06* (2013.01); *H01L 25/50* (2013.01);
(Continued)

(58) Field of Classification Search
CPC ..... H01L 25/0657; H01L 24/06; H01L 25/50; H01L 2224/06517; H01L 2225/06513; H01L 2225/06541
See application file for complete search history.

(56) References Cited

U.S. PATENT DOCUMENTS 6,812,567 B2 11/2004 Kim et al.
7,061,122 B2 6/2006 Kim et al.
(Continued)

FOREIGN PATENT DOCUMENTS

JP 2009-049087 A 3/2009
JP 2015-041743 A 3/2015
KR 10-0879191 B1 1/2009

*Primary Examiner* — Thao P Le
(74) *Attorney, Agent, or Firm* — Muir Patent Law, PLLC

(57) ABSTRACT

A semiconductor chip including a semiconductor substrate having a first surface and a second surface and having an active layer in a region adjacent to the first surface, a first through electrode penetrating at least a portion of the semiconductor substrate and connected to the active layer, a second through electrode located at a greater radial location from the center of the semiconductor substrate than the first through electrode, penetrating at least a portion of the semiconductor substrate, and connected to the active layer. The semiconductor chip also including a first chip connection pad having a first height and a first width, located on the second surface of the semiconductor substrate, and connected to the first through electrode, and a second chip connection pad having a second height greater than the first height and a second width greater than the first width, located on the second surface of the semiconductor substrate, and connected to the second through electrode.

20 Claims, 19 Drawing Sheets

(52) U.S. Cl.
CPC ............... *H01L 2224/06517* (2013.01); *H01L 2225/06513* (2013.01); *H01L 2225/06541* (2013.01); *H01L 2225/06586* (2013.01); *H01L 2225/06589* (2013.01)

(56) References Cited

U.S. PATENT DOCUMENTS

| | | | |
|---|---|---|---|
| 7,842,541 B1 | 11/2010 | Rusli et al. | |
| 8,067,267 B2 | 11/2011 | Haba et al. | |
| 8,324,740 B2 * | 12/2012 | Hagihara | H01L 21/563 |
| | | | 257/786 |
| 9,059,106 B2 | 6/2015 | Daubenspeck et al. | |
| 9,099,364 B1 | 8/2015 | Hsu | |
| 9,589,910 B2 * | 3/2017 | Pagaila | H01L 21/56 |
| 10,593,645 B2 * | 3/2020 | Shikibu | H01L 24/14 |
| 11,211,335 B2 * | 12/2021 | Park | H01L 23/5384 |
| 2017/0103932 A1 * | 4/2017 | Takemura | C25D 5/48 |
| 2018/0211943 A1 * | 7/2018 | Song | H01L 25/105 |
| 2020/0388549 A1 * | 12/2020 | Kim | H01L 21/566 |
| 2021/0104483 A1 * | 4/2021 | Park | H01L 24/83 |
| 2021/0118803 A1 * | 4/2021 | Park | H01L 25/0657 |
| 2021/0125955 A1 * | 4/2021 | Suh | H01L 24/27 |
| 2021/0272930 A1 * | 9/2021 | Choi | H01L 23/3128 |
| 2021/0288028 A1 * | 9/2021 | Lee | H01L 21/76898 |
| 2021/0305188 A1 * | 9/2021 | Shin | H01L 23/291 |
| 2022/0013498 A1 * | 1/2022 | Kim | H01L 25/0655 |
| 2022/0013502 A1 * | 1/2022 | Lee | H01L 25/0657 |

* cited by examiner

SEMICONDUCTOR CHIP, SEMICONDUCTOR DEVICE, AND SEMICONDUCTOR PACKAGE INCLUDING THE SEMICONDUCTOR CHIP

CROSS-REFERENCE TO RELATED APPLICATION

This application is based on and claims priority under 35 U.S.C. § 119 to Korean Patent Application No. 10-2020-0069093, filed on Jun. 8, 2020, in the Korean Intellectual Property Office, the disclosure of which is incorporated by reference herein in its entirety.

BACKGROUND

The inventive concept relates to a semiconductor package.

As the storage capacity of semiconductor packages increases, semiconductor packages including semiconductor chips are required to be thin and light. In addition, research has been conducted to embed semiconductor chips having various functions in semiconductor packages and to quickly drive the semiconductor chips.

In response to this trend, research on semiconductor packages including a plurality of semiconductor chips having a stacked structure have been conducted. For example, in a step of mounting a second semiconductor chip on a first semiconductor chip, research on improving the adhesion reliability at edges of the first semiconductor chip and the second semiconductor has been conducted.

SUMMARY

The inventive concept provides a semiconductor device with improved adhesion reliability at edges to which semiconductor chips are adhered, and a semiconductor package including the same.

The inventive concept provides a semiconductor device with improved electrical connection structure at edges to which semiconductor chips are adhered, and a semiconductor package including the same.

The inventive concept provides a semiconductor package with improved heat dissipation performance while being thin and light.

According to an aspect of the inventive concept, there is provided a semiconductor chip including: a semiconductor substrate having a first surface and a second surface opposite to the first surface, the semiconductor substrate comprising an active layer in a region adjacent to the first surface, a first through electrode penetrating at least a portion of the semiconductor substrate and connected to the active layer, a second through electrode located at a greater radial location from the center of the semiconductor substrate than the first through electrode, penetrating at least a portion of the semiconductor substrate, and connected to the active layer, a first chip connection pad having a first height and a first width, located on the second surface of the semiconductor substrate, and connected to the first through electrode; and, a second chip connection pad having a second height greater than the first height and a second width greater than the first width, located on the second surface of the semiconductor substrate, and connected to the second through electrode.

According to an aspect of the inventive concept, there is provided a semiconductor device including: a first semiconductor chip including a first semiconductor substrate having a first surface and a second surface opposite to the first surface and having a first active layer in a region adjacent to the first surface, a first lower through electrode penetrating at least a portion of the first semiconductor substrate and connected to the first active layer, a second lower through electrode located at a greater radial location from the center of the first semiconductor substrate than the first lower through electrode, penetrating at least a portion of the first semiconductor substrate, and connected to the first active layer, a first lower chip connection pad having a first height and a first width, located on the second surface of the first semiconductor substrate, and connected to the first lower through electrode, and a second lower chip connection pad having a second height greater than the first height and a second width greater than the first width, located on the second surface of the first semiconductor substrate, and connected to the second lower through electrode; a second semiconductor chip mounted on the first semiconductor chip, the second semiconductor chip including a second semiconductor substrate having a third surface and a fourth surface opposite to the third surface, a second active layer in a region adjacent to the third surface, and a redistribution structure on the third surface, a first upper bump pad on the redistribution structure and coupled to the first lower chip connection pad of the first semiconductor chip, a second upper bump pad on the redistribution structure and coupled to the second lower chip connection pad of the first semiconductor chip, a first upper connection member provided between and in contact with the first upper bump pad and the first lower chip connection pad, and a second upper connection member provided between and in contact with the second upper bump pad and the second lower chip connection pad; and an adhesive layer provided between the first semiconductor chip and the second semiconductor chip, and surrounding the first upper bump pad, the second upper bump pad, the first lower chip connection pad, the second lower chip connection pad, the first upper connection member, and the second upper connection member.

According to an aspect of the inventive concept, there is provided a semiconductor package including: a package substrate; a first semiconductor chip mounted on the package substrate, the first semiconductor chip including a first semiconductor substrate having a first surface and a second surface opposite to the first surface, a first lower through electrode penetrating at least a portion of the first semiconductor substrate, a second lower through electrode located at a greater radial location from the center of the first semiconductor substrate than the first lower through electrode and penetrating at least a portion of the first semiconductor substrate, a first lower chip connection pad having a first height, located on the second surface of the first semiconductor substrate, and connected to the first lower through electrode and, a second lower chip connection pad having a second height greater than the first height, located on the second surface of the first semiconductor substrate, and connected to the second lower through electrode, and a lower redistribution structure on the first surface, a second semiconductor chip mounted on the first semiconductor chip, the second semiconductor chip including a second semiconductor substrate having a third surface and a fourth surface opposite to the third surface, an upper redistribution structure on the third surface, a first upper bump pad on the upper redistribution structure and coupled to the first lower chip connection pad of the first semiconductor chip, a second upper bump pad on the upper redistribution structure and coupled to the second lower chip connection pad of the first semiconductor chip, a first upper connection member provided between and in contact with the first upper bump pad and the first lower chip connection pad, and a second upper connection member provided between and in contact with the second upper bump pad and the second lower chip connection pad, and an adhesive layer provided between the first semiconductor chip and the second semiconductor chip, and surrounding the first upper bump pad, the second upper bump pad, the first lower chip connection pad, the second lower chip connection pad, the first upper connection member, and the second upper connection member; and a molding member surrounding the first semiconductor chip and the second semiconductor chip on the package substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
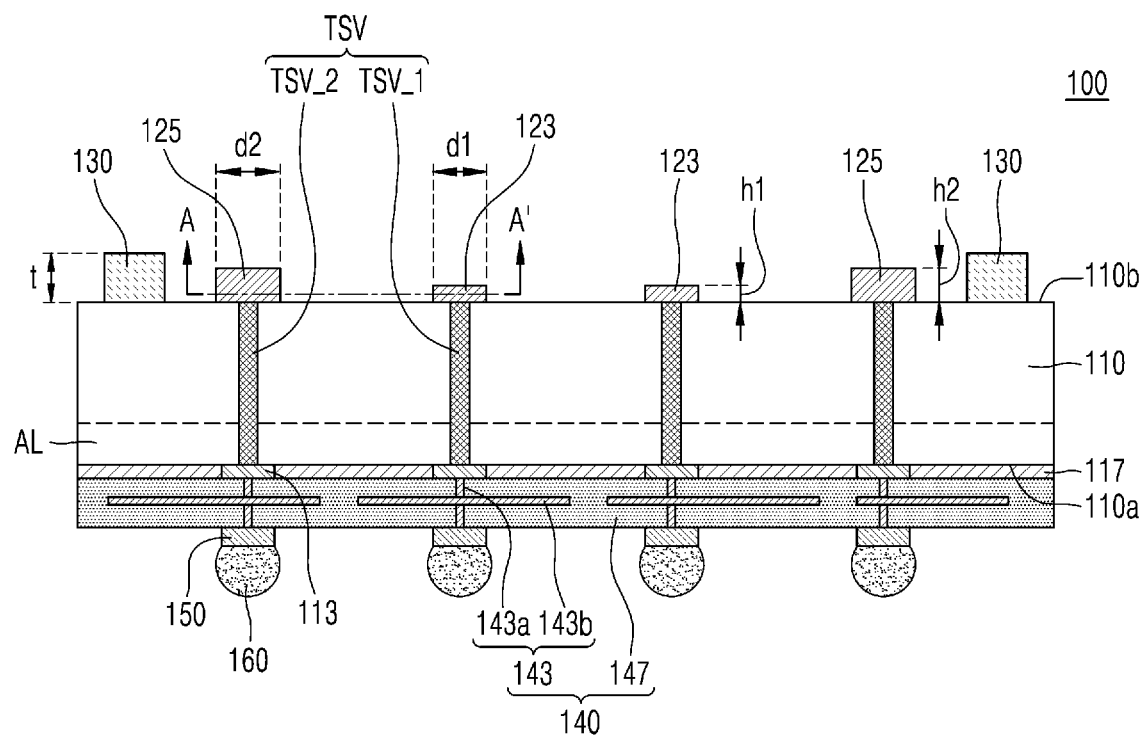
FIG. 1 is a cross-sectional view illustrating a semiconductor chip according to an example embodiment of the inventive concept.

Hereinafter, example embodiments of the inventive concept will be described in detail with reference to the accompanying drawings. The same reference numerals are used for the same components through the drawings, and duplicate descriptions thereof are omitted. FIG. 1 is a cross-sectional view illustrating a semiconductor chip 100 according to an example embodiment of the inventive concept, and FIG. 2 is a cross-sectional view of a region taken along line A-A' in FIG. 1.

Figure 2:
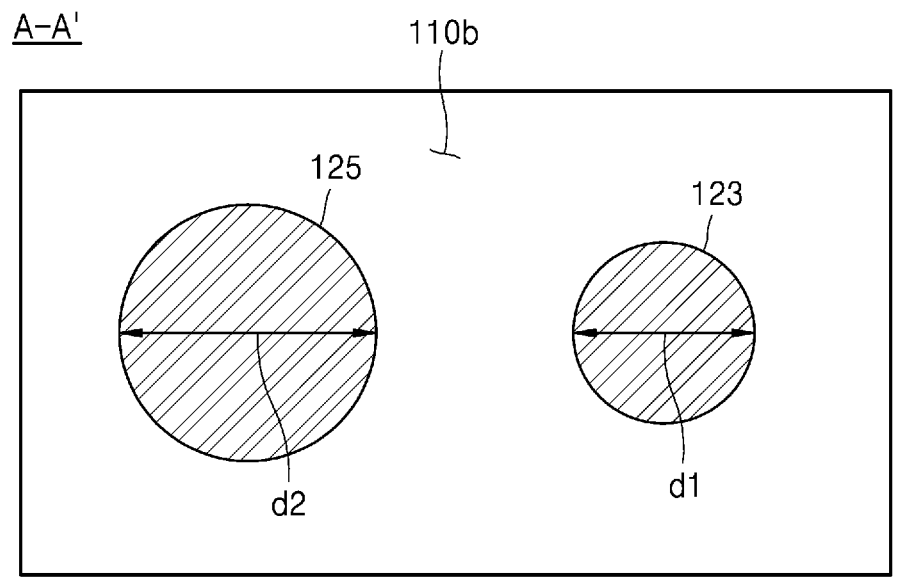
FIG. 2 is a cross-sectional view of a region taken along line A-A' in FIG. 1.

Referring to FIGS. 1 and 2 together, the semiconductor chip 100 according to an example embodiment of the inventive concept may include a semiconductor substrate 110, a through electrode, such as a through-silicon via (TSV), a chip pad 113, a passivation layer 117, a first chip connection pad 123, a second chip connection pad 125, a dummy pad 130, a redistribution structure 140, a bump pad 150, and a connection member 160, and the like.

The semiconductor substrate 110 may have a first surface 110a and a second surface 110b opposed to the first surface 110a. For example, the first surface 110a may be a lower surface of the semiconductor substrate 110 and the second surface 110b may be a top surface of the semiconductor substrate 110. The first surface 110a and the second surface 110b may be planar. It will be appreciated that "planarization," "co-planar," "planar," etc., as used herein refer to structures (e.g., surfaces) that need not be perfectly geometrically planar, but may include acceptable variances that may result from standard manufacturing processes.

In an example embodiment, the semiconductor substrate 110 may include an active layer AL in a region adjacent to the first surface 110a. The active layer AL may include a plurality of individual devices of various types. For example, the plurality of individual devices may include various microelectronic devices, for example, a complementary metal-oxide semiconductor (CMOS) transistor, a metal-oxide-semiconductor field effect transistor (MOSFET), a system large scale integration (system LSI), an image sensor such as a CMOS imaging sensor (CIS), a micro-electromechanical system (MEMS), an active device, and a passive device, and the like.

In an example embodiment, the semiconductor substrate 110 may include or may be formed of silicon (Si). In addition, the semiconductor substrate 110 may include or may be formed of a semiconductor element such as germanium (Ge), or a compound such as silicon carbide (SiC), gallium arsenide (GaAs), indium arsenide (InAs), and indium phosphide (InP). However, the material of the semiconductor substrate 110 is not limited to the above.

The through electrode TSV may penetrate at least a portion of the semiconductor substrate 110 in a vertical direction and may be electrically connected to the plurality of individual devices in the active layer AL. The vertical direction may be a direction perpendicular to a direction to which the first and second surfaces 110a and 110b of the semiconductor substrate 110 extend.

In an example embodiment, the through electrode TSV may completely penetrate the semiconductor substrate 110 in the vertical direction and may be electrically connected to the plurality of individual devices in the active layer AL. When the through electrode TSV completely penetrates the semiconductor substrate 110 in the vertical direction, the through electrode TSV may be exposed at the first and second surfaces 110a and 110b of the semiconductor substrate 110.

The formation of the through electrode TSV is not limited to the above, and the through electrode TSV may penetrate only a portion of the semiconductor substrate 110 in the vertical direction and may be electrically connected to the plurality of individual devices in the active layer AL. When the through electrode TSV penetrates only a portion of the semiconductor substrate 110 in the vertical direction, the through electrode TSV is not exposed at the first surface 110a of the semiconductor substrate 110, but the through electrode TSV may be exposed at the second surface 110b of the semiconductor substrate 110.

In an example embodiment, the through electrode TSV may include a first through electrode TSV_1 that penetrates a central portion of the semiconductor substrate 110 and is electrically connected to the active layer AL. In addition, the through electrode TSV may include a second through electrode TSV_2 that penetrates an edge portion of the semiconductor substrate 110 and is electrically connected to the active layer AL. In other words, the second through electrode TSV_2 may be provided outside the first through electrode TSV_1. That is, the second through electrode TSV_2 may be provided at a greater radial location from the center of the semiconductor substrate 110 than the first through electrode TSV_1. As a result, the second through electrode TSV_2 is provided closer to the edge of the semiconductor substrate 110 than the first through electrode TSV_1.

In an example embodiment, the through electrode TSV may have a shape of a pillar. The through electrode TSV may include a barrier layer formed on a surface of the pillar and a buried conductive layer filling the inside of the barrier layer.

The chip pad 113 may be a pad that is on the first surface 110a of the semiconductor substrate 110 and is electrically connected to the plurality of individual devices in the active layer AL of the semiconductor substrate 110.

In the example embodiment, the material of the chip pad 113 may include or may be formed of a metal such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or alloys thereof. However, the material of the chip pad 113 is not limited to the above.

The passivation layer 117 may be on the first surface 110a of the semiconductor substrate 110 and may surround side surfaces of the chip pad 113. In addition, the passivation layer 117 may not cover one surface of the chip pad 113 (e.g., the one surface of the chip pad 113 may include the surface of the chip pad 133 in contact with the through electrode TSV). In an example embodiment, the passivation layer 117 may include or may be formed of an insulating material, such as an insulating polymer.

The first chip connection pad 123 may be a pad that is located on the second surface 110b of the semiconductor substrate 110 so as to contact the first through electrode TSV_1. The first chip connection pad 123 may electrically connect the semiconductor chip 100 to a separate semiconductor chip that may be mounted on the semiconductor chip 100. In addition, the first chip connection pad 123 may be electrically connected to the plurality of individual devices in the active layer AL through the first through electrode TSV_1.

The first chip connection pad 123 may have a first height h1. The first height h1 of the first chip connection pad 123 may be defined as a length of the first chip connection pad 123 in the vertical direction. That is, the first height h1 of the first chip connection pad 123 may be defined as the length of the first chip connection pad 123 in a direction perpendicular to the direction to which the second surface 110b of the semiconductor substrate 110 extends.

In addition, the first chip connection pad 123 may have a first width d1. The first width d1 of the first chip connection pad 123 may be defined as a length of the first chip connection pad 123 in a horizontal direction. That is, the first width d1 of the first chip connection pad 123 may be defined as the length of the first chip connection pad 123 in a direction parallel to the direction to which the second surface 110b of the semiconductor substrate 110 extends.

The second chip connection pad 125 may be a pad that is located on the second surface 110b of the semiconductor substrate 110 so as to contact the second through electrode TSV_2. The second chip connection pad 125 may electrically connect the semiconductor chip 100 to a separate semiconductor chip that may be mounted on the semiconductor chip 100. The second chip connection pad 125 may be electrically connected to the plurality of individual devices in the active layer AL through the second through electrode TSV_2. Further, the second chip connection pad 125 may be provided outside the first chip connection pad 123. That is, the second chip connection pad 125 may be provided at a greater radial location from the center of the semiconductor substrate 110 than the first chip connection pad 123. As a result, the second chip connection pad 125 is provided closer to the edge of the semiconductor substrate 110 than the first chip connection pad 123.

The second chip connection pad 125 may have a second height h2. The second height h2 of the second chip connection pad 125 may be defined as a length in the vertical direction of the second chip connection pad 125. That is, the second height h2 of the second chip connection pad 125 may be defined as the length of the second chip connection pad 125 in a direction perpendicular to the direction to which the second surface 110b of the semiconductor substrate 110 extends. In addition, the second chip connection pad 125 may have a second width d2. The second width d2 of the second chip connection pad 125 may be defined as a length of the second chip connection pad 125 in the horizontal direction. That is, the second width d2 of the second chip connection pad 125 may be defined as the length of the second chip connection pad 125 in a direction parallel to the direction to which the second surface 110b of the semiconductor substrate 110 extends.

The second height h2 of the second chip connection pad 125 may be greater than the first height h1 of the first chip connection pad 123. The second height h2 of the second chip connection pad 125 provided outside the first chip connection pad 123 may be greater than the first height h1 of the first chip connection pad 123, so that the adhesion reliability at edges of the first semiconductor chip 100 and a separate semiconductor chip to be mounted on the first semiconductor chip 100 is increased. The above effect will be described in more detail with reference to FIGS. 6 to 10.

In the example embodiment, the second height h2 of the second chip connection pad 125 may be about 1.1 times to about 2.5 times the first height h1 of the first chip connection pad 123. For example, the first height h1 of the first chip connection pad 123 may be about 1 micrometer to about 20 micrometers. In addition, the second height h2 of the second chip connection pad 125 may be about 1.1 micrometers to about 50 micrometers. For example, when the first height h1 of the first chip connection pad 123 is about 10 micrometers, the second height h2 of the second chip connection pad 125 may be about 11 micrometers to about 25 micrometers. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In addition, the second width d2 of the second chip connection pad 125 may be greater than the first width d1 of the first chip connection pad 123. The second width d2 of the second chip connection pad 125 provided outside the first chip connection pad 123 may be greater than the first width d1 of the first chip connection pad 123, so that the adhesion reliability at edges of the first semiconductor chip 100 and a separate semiconductor chip (for example, a second semiconductor chip 200 in FIG. 3) to be mounted on the first semiconductor chip 100 is increased. The above effect will be described in more detail with reference to FIGS. 6 to 10. The first width d1 of the first chip connection pad 123 may be greater than the width of the through electrode TSV_1. The second width d2 of the second chip connection pad 125 may be greater than the width of the through electrode TSV_2.

In the example embodiment, the second width d2 of the second chip connection pad 125 may be about 1.1 times to about 2.5 times the first width d1 of the first chip connection pad 123. For example, the first width d1 of the first chip connection pad 123 may be about 1 micrometer to about 30 micrometers. In addition, the second width d2 of the second chip connection pad 125 may be about 1.1 micrometers to about 75 micrometers.

For example, when the first width d1 of the first chip connection pad 123 is about 10 micrometers, the second width d2 of the second chip connection pad 125 may be about 11 micrometers to about 25 micrometers.

In the example embodiment, when the first chip connection pad 123 and the second chip connection pad 125 are viewed in plan view, cross-sections of the first chip connection pad 123 and the second chip connection pad 125 may be circular. However, the cross-sections of the first chip connection pad 123 and the second chip connection pad 125 may have a shape of ellipse or a shape of polygon such as triangle, quadrangle, and hexagon.

In the example embodiment, the first and second chip connection pads 123 and 125 may include or may be formed of a metal such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or alloys thereof. However, the material of the chip pad 113 is not limited to the above.

The dummy pad 130 may be a pad that is on the second surface 110b of the semiconductor substrate 110 and is not electrically connected to any of the through electrodes TSV of the semiconductor substrate 110 and, therefore, is also not connected to the active layer AL1 of the semiconductor substrate 110. In the example embodiment, the dummy pad 130 may be a pad provided outside the second chip connection pad 125. That is, the dummy pad 130 may be provided at a greater radial location from the center of the semiconductor substrate 110 than the second chip connection pad 125. As a result, the dummy pad 130 is provided closer to the edge of the semiconductor substrate 110 than the second chip connection pad 125.

A height t of the dummy pad 130 may be greater than the height h2 of the second chip connection pad 125. In the example embodiment, the height t of the dummy pad 130 may be about 1.1 times to about 1.5 times the height h2 of the second chip connection pad 125. For example, when the height h2 of the second chip connection pad 125 is about 20 micrometers, the height t of the dummy pad 130 may be about 22 micrometers to about 30 micrometers.

The dummy pad 130 may be provided at an edge of the second chip connection pad 125 and the height t of the dummy pad 130 may be greater than the height h2 of the second chip connection pad 125, so that in a step of mounting the separate semiconductor chip on the semiconductor chip 100, the dummy pad 130 may prevent a phenomenon in which an adhesive layer 710 (see FIG. 3) may flow beyond an edge of the semiconductor chip 100.

In addition, in the step of mounting the separate semiconductor chip on the semiconductor chip 100, the dummy pad 130 may prevent a phenomenon in which a connection member 265 (see FIG. 3) on the second chip connection pad 125 may protrude from the edge of the semiconductor chip 100. In other words, the dummy pad 130 may be a defense wall to prevent the connection member 265 on the second chip connection pad 125 from protruding from the edge of the semiconductor chip 100 and extending out of the adhesive layer 710.

The redistribution structure 140 may be on the first surface 110a of the semiconductor substrate 110. The redistribution structure 140 may include a redistribution pattern 143 electrically connected to the chip pad 113 and a redistribution insulating layer 147 surrounding the redistribution pattern 143.

In an example embodiment, the redistribution insulating layer 147 may include or may be formed of an insulating material that includes a photo imageable dielectric (PID) material capable of a photolithography process. For example, the redistribution insulating layer 147 may include or may be formed of a photosensitive polyimide (PSPI).

However, the inventive concept is not limited thereto, and the redistribution insulating layer 147 may include or may be formed of an oxide or nitride. For example, the redistribution insulating layer 147 may include or may be formed of silicon oxide or silicon nitride.

In an example embodiment, the redistribution pattern 143 may include a conductive pattern electrically connected to the chip pad 113. For example, the redistribution pattern 143 may include a redistribution via pattern 143a extending in the vertical direction within the redistribution insulating layer 147 and a redistribution line pattern 143b extending in the horizontal direction within the redistribution insulating layer 147.

In the example embodiment, the redistribution pattern 143 may include or may be formed of a metal such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or alloys thereof.

The bump pad 150 may be a pad electrically connected to the redistribution pattern 143 on the redistribution structure 140. Further, the bump pad 150 may be a pad for connecting the first semiconductor chip 100 to a separate semiconductor chip or an external device.

In the example embodiment, a plurality of bump pads 150 may be provided. In addition, dimensions of the plurality of bump pads 150 may be substantially the same. For example, the height and width of each of the plurality of bump pads 150 may be substantially the same. The height of the plurality of bump pads 150 may be about 1 micrometer to about 30 micrometers. Terms such as "same" or "equal" as used herein encompass identicality or near identicality including variations that may occur, for example, due to manufacturing processes. The term "substantially" may be used herein to emphasize this meaning, unless the context or other statements indicate otherwise.

In the example embodiment, the bump pad 150 may include or may be formed of a metal such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or alloys thereof.

The connection member 160 may include a conductive material attached to the bump pad 150. For example, the connection member 160 may include a solder ball of the conductive material for connecting the semiconductor chip 100 to a separate semiconductor chip or an external device.

In the example embodiment, the material of the connection member 160 may include or may be formed of a metal such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or alloys thereof.

Figure 3:
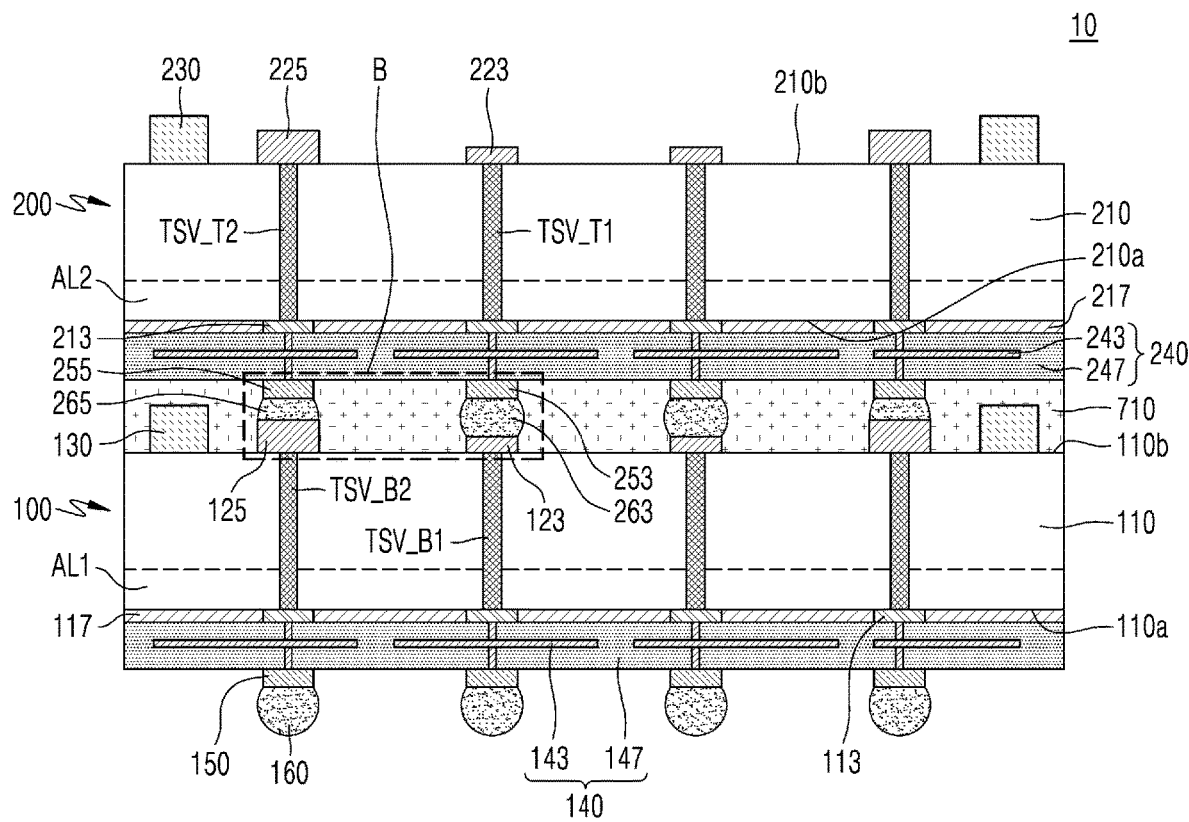
FIG. 3 is a cross-sectional view of a first semiconductor device according to an example embodiment of the inventive concept.
Figure 4:
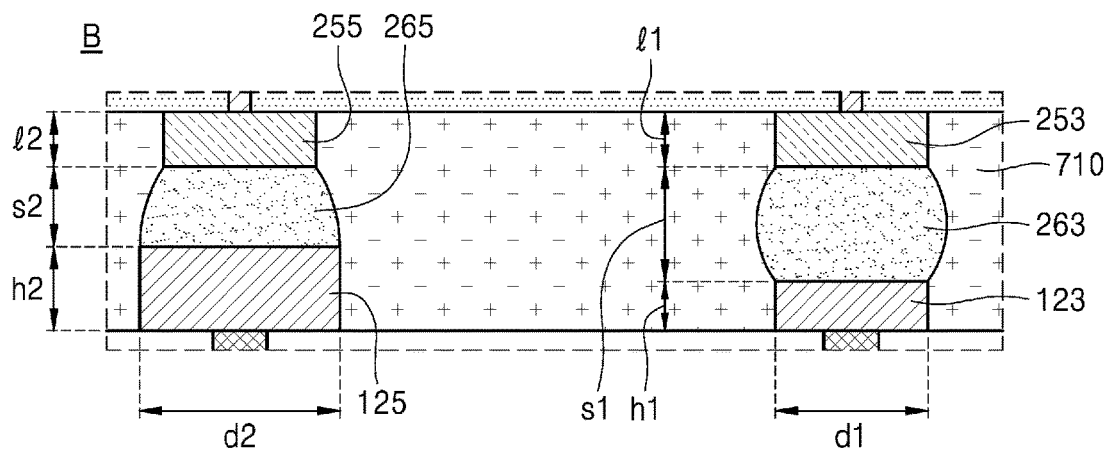
FIG. 4 is an enlarged view of a region indicated by "B" in FIG. 3.

FIG. 3 is a cross-sectional view of a first semiconductor device 10 according to an example embodiment of the inventive concept, and FIG. 4 is an enlarged view of a region indicated by "B" in FIG. 3.

Referring to FIG. 3, the first semiconductor device 10 may include a first semiconductor chip 100 and a second semiconductor chip 200. The first semiconductor chip 100 is similar to semiconductor chip 100 described above with respect to FIG. 1, but it is referred to from here on in as the "first semiconductor chip 100" for clarity when discussing the "second semiconductor chip 200." The first semiconductor device 10 may include a structure in which the second semiconductor chip 200 is mounted on the first semiconductor chip 100.

The first semiconductor chip 100 may include a first semiconductor substrate 110, a first lower through electrode TSV_B1, a second lower through electrode TSV_B2, a lower chip pad 113, a lower passivation layer 117, a first lower chip connection pad 123, a second lower chip connection pad 125, a lower dummy pad 130, a lower redistribution structure 140, a lower bump pad 150, and a lower connection member 160, and the like.

The second semiconductor chip 200 may include a second semiconductor substrate 210, a first upper through electrode TSV_T1, a second upper through electrode TSV_T2, an upper chip pad 213, an upper passivation layer 217, a first upper chip connection pad 223, a second upper chip connection pad 225, an upper dummy pad 230, an upper redistribution structure 240, a first upper bump pad 253, a second upper bump pad 255, a first upper connection member 263, and a second upper connection member 265, and the like. The second semiconductor chip 200 may have a third surface 210a and a fourth surface 210b and may include a second active layer AL2 formed in a region adjacent to the third surface 210a. Among components of the first semiconductor chip 100 and the second semiconductor chip 200, contents overlapping with those described with reference to FIGS. 1 and 2 will be omitted.

The first upper connection member 263 may be between and in contact with the first lower chip connection pad 123 of the first semiconductor chip 100 and the first upper bump pad 253 of the second semiconductor chip 200 and thereby couple the first lower chip connection pad 123 to the first upper bump pad 253. The second upper connection member 265 may be between and in contact with the second lower chip connection pad 125 of the first semiconductor chip 100 and the second upper bump pad 255 of the second semiconductor chip 200 and thereby couple the second lower chip connection pad 125 to the second upper bump pad 255. Accordingly, the first upper connection member 263 and the second upper connection member 265 may be connection members configured to electrically connect the first semiconductor chip 100 to the second semiconductor chip 200. It will be understood that when an element is referred to as being "connect(ed)" or "couple(d)" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The adhesive layer 710 may be between the first semiconductor chip 100 and the second semiconductor chip 200, and may surround the first lower chip connection pad 123, the second lower chip connection pad 125, and the lower dummy pad 130 of the first semiconductor chip 100, and the first upper bump pad 253, the second upper bump pad 255, the first upper connection member 263, and the second upper connection member 265 of the second semiconductor chip 200. For example, the adhesive layer 710 may have a height of about 1 micrometer to 100 micrometers.

In an example embodiment, the adhesive layer 710 may include a material whose flowability is changed by heat. In addition, the adhesive layer 710 may include a film or a tape having adhesive properties. For example, the adhesive layer 710 may include a double-sided adhesive film or a double-sided adhesive tape.

As described above, the second height h2 of the second lower chip connection pad 125 of the first semiconductor chip 100 may be greater than the first height h1 of the first lower chip connection pad 123. For example, the second height h2 of the second lower chip connection pad 125 may be about 1.1 times to about 2.5 times the first height h1 of the first lower chip connection pad 123.

The second height h2 of the second lower chip connection pad 125 provided outside the first lower chip connection pad 123 may be greater than the first height h1 of the first chip connection pad 123, so that the adhesion reliability of the second lower chip connection pad 125 of the first semiconductor chip 100 and the second upper bump pad 255 may be improved. The above effect will be described in detail with reference to FIGS. 6 to 9.

In addition, the second width d2 of the second lower chip connection pad 125 of the first semiconductor chip 100 may be greater than the first width d1 of the first lower chip connection pad 123. For example, the second width d2 of the second lower chip connection pad 125 may be about 1.1 times to about 1.5 times the first width d1 of the first lower chip connection pad 123.

The second width d2 of the second lower chip connection pad 125 provided outside the first lower chip connection pad 123 may be larger than the first width d1 of the first lower chip connection pad 123, so that the adhesion reliability of the second lower chip connection pad 125 of the first semiconductor chip 100 and the second upper bump pad 255 may be improved. The above effect will be described in detail with reference to FIGS. 6 to 10.

In an example embodiment, a top surface of the first lower chip connection pad 123 of the first semiconductor chip 100 and a lower surface of the first upper bump pad 253, that corresponds to the first lower chip connection pad 123, of the second semiconductor chip 200 may have substantially the same dimensions. For example, the top surface of the first lower chip connection pad 123 and the lower surface of the first upper bump pad 253 may have substantially the same width and area.

Accordingly, the first upper connection member 263 interposed between the first lower chip connection pad 123 and the first upper bump pad 253 may have a shape in which a horizontal cross-sectional area increases toward a central portion thereof in the vertical direction.

In the example embodiment, an area of the top surface of the second lower chip connection pad 125 of the first semiconductor chip 100 may be greater than an area of the lower surface of the second upper bump pad 255, that corresponds to the second lower chip connection pad 125, of the second semiconductor chip 200. In addition, the width of the top surface of the second lower chip connection pad 125 may be greater than the width of the lower surface of the second upper bump pad 255.

Accordingly, the second upper connection member 265 interposed between the second lower chip connection pad 125 and the second upper bump pad 255 may have a shape in which the horizontal cross-sectional area increases in a vertical direction toward the second lower chip connection pad 125.

In the example embodiment, a height s1 of the first upper connection member 263 may be about 1.1 times to about 2.5 times a height s2 of the second upper connection member 265. For example, when the height s2 of the second upper connection member 265 is about 1 micrometer to about 20 micrometers, the height s1 of the first upper connection member 263 may be about 1.1 micrometers to about 50 micrometers.

The first upper bump pad 253 may have a height l1. The height l1 of the first upper bump pad 253 may be defined as a length of the first upper bump pad 253 in the vertical direction. That is, height l1 of the first upper bump pad 253 may be defined as the length of the first upper bump pad 253 in a direction perpendicular to the direction to which the third surface 210a of the second semiconductor substrate 210 extends. The first upper bump pad 253 may have a height l1. The height l2 of the second upper bump pad 255 may be defined as a length of the second upper bump pad 255 in the vertical direction. That is, height l2 of the second upper bump pad 255 may be defined as the length of the second upper bump pad 255 in a direction perpendicular to the direction to which the third surface 210a of the second semiconductor substrate 210 extends.

A sum (h1+l1+s1) of heights of the first lower chip connection pad 123, the first upper bump pad 253 corresponding to the first lower chip connection pad 123, and the first upper connection member 263 may be substantially the same as a sum (h2+l2+s2) of heights of the second lower chip connection pad 125, the second upper bump pad 255 corresponding to the second lower chip connection pad 125, and the second upper connection member 265.

In an example embodiment, the sum (h1+l1+s1) of the heights of the first lower chip connection pad 123, the first upper bump pad 253, and the first upper connection member 263 may be substantially the same as the height of the adhesive layer 710. In addition, the sum (h2+l2+s2) of the heights of the second lower chip connection pad 125, the second upper bump pad 255, and the second upper connection member 265 may be substantially the same as the height of the adhesive layer 710.

In an example embodiment, the first semiconductor chip 100 and the second semiconductor chip 200 may be different types of semiconductor chips. For example, the first semiconductor chip 100 may include a logic semiconductor chip. The logic semiconductor chip may include, for example, a central processor unit (CPU), a microprocessor unit (MPU), a graphic processor unit (GPU), and an application processor (AP), or the like.

In addition, the second semiconductor chip 200 may include a memory semiconductor chip. The memory semiconductor chip may include, for example, a volatile memory semiconductor chip such as dynamic random access memory (DRAM) or static random access memory (SRAM), and may include a non-volatile memory semiconductor chip such as phase-change random access memory (PRAM), magneto-resistive random access memory (MRAM), ferroelectric random access memory (FeRAM), or resistive random access memory (RRAM).

However, the inventive concept is not limited to the above, and the first semiconductor chip 100 may be the memory semiconductor chip, and the second semiconductor chip 200 may be the logic semiconductor chip. In addition, the first semiconductor chip 100 and the second semiconductor chip 200 may be the same type of semiconductor chip.

Figure 5:
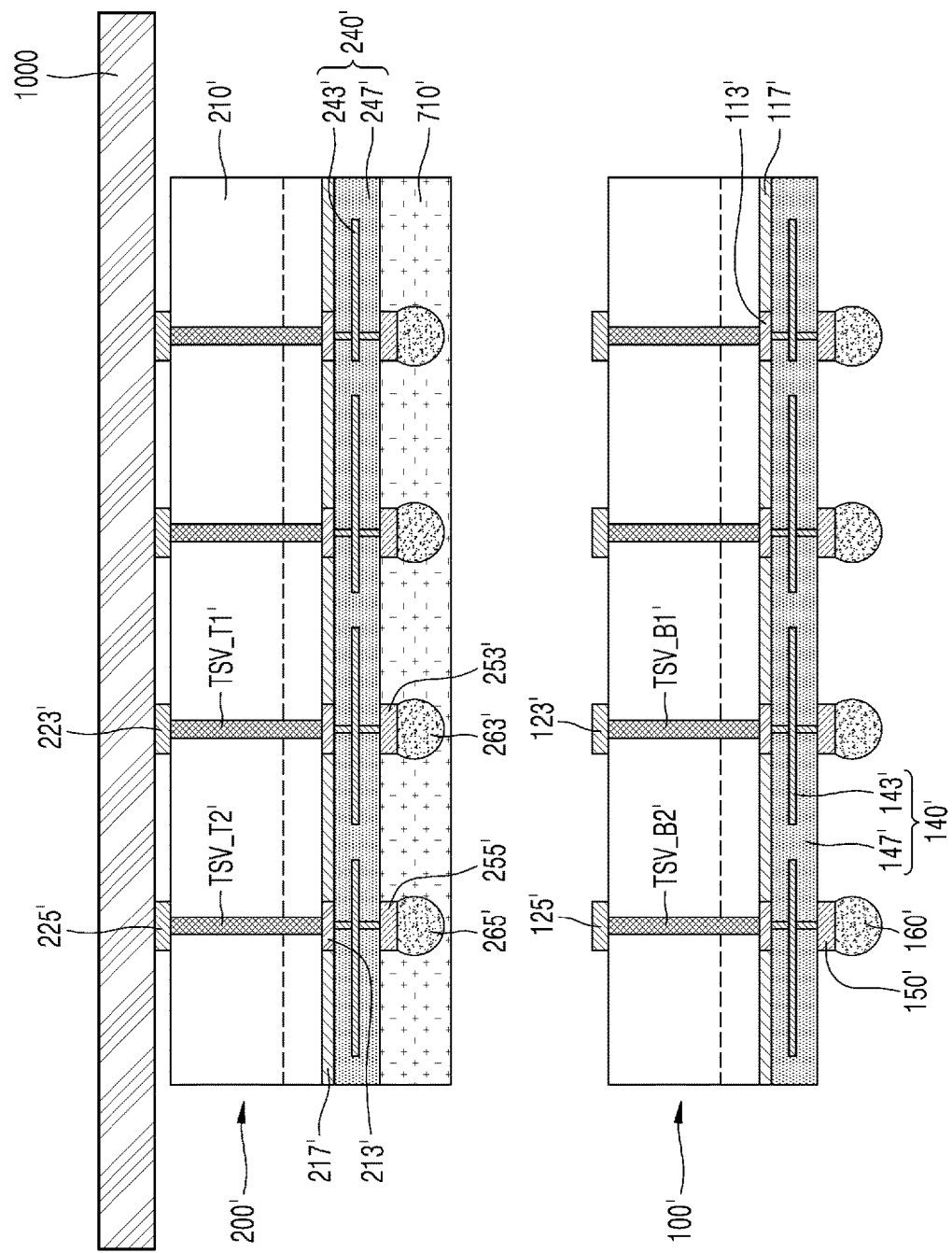
FIG. 5 is a diagram illustrating a step of mounting a second semiconductor chip on a first semiconductor chip according to a comparative example.

FIG. 5 is a diagram illustrating a step of mounting a second semiconductor chip 200' on a first semiconductor chip 100' according to a comparative example.

Referring to FIG. 5, a first lower chip connection pad 123' and a second lower chip connection pad 125' included in the first semiconductor chip 100' may have the same dimensions. For example, the first lower chip connection pad 123' and the second lower chip connection pad 125' may have the same height and width. Further, a first upper chip connection pad 223' and a second upper chip connection pad 225' included in the second semiconductor chip 200' may also have the same dimensions.

In addition, the second semiconductor chip 200' according to a comparative example may include a first upper connection member 263' and a second upper connection member 265' that respectively corresponds to the first lower chip connection pad 123' and the second lower chip connection pad 125' of the first semiconductor chip 100'.

In the step of mounting the second semiconductor chip 200' on the first semiconductor chip 100', a chip bonding apparatus 1000 may fix an upper portion of the second semiconductor chip 200'. In a step of fixing the second semiconductor chip 200' by the chip bonding apparatus 1000, the first upper chip connection pad 223' and the second upper chip connection pad 225' of the second semiconductor chip 200' may contact a lower surface of the chip bonding apparatus 1000. Since heights of the first upper chip connection pad 223' and the second upper chip connection pad 225' that contact the chip bonding apparatus 1000 may be substantially the same, the second semiconductor chip 200' may be flat.

In the step of mounting the second semiconductor chip 200' on the first semiconductor chip 100', the chip bonding apparatus 1000 may apply an external force on the second semiconductor chip 200' in a direction toward the first semiconductor chip 100' and simultaneously may heat the second semiconductor chip 200'.

At this time, due to heat loss at the edge of the chip bonding apparatus 1000 due to thermal convection, the heat transferred from the chip bonding device 1000 to the second semiconductor chip 200' may be concentrated in a central portion of the second semiconductor chip 200'. In this case, in the step of mounting the second semiconductor chip 200' on the first semiconductor chip 100', the flowability of the adhesive layer 710' at the edge of the second semiconductor chip 200' may be less than the flowability of the adhesive layer 710' at the central portion.

In addition, the amount of heat transferred to the second upper connection member 265' of the second semiconductor chip 200' may be less than the amount of heat transferred to the first upper connection member 263'. Accordingly, the adhesive property between the second lower chip connection pad 125' and the second upper connection member 265' may be less than the adhesive property between the first lower chip connection pad 123' and the first upper connection member 263'. This may weaken the adhesion reliability at the edges of the first semiconductor chip 100' and the second semiconductor chip 200'.

Figure 6:
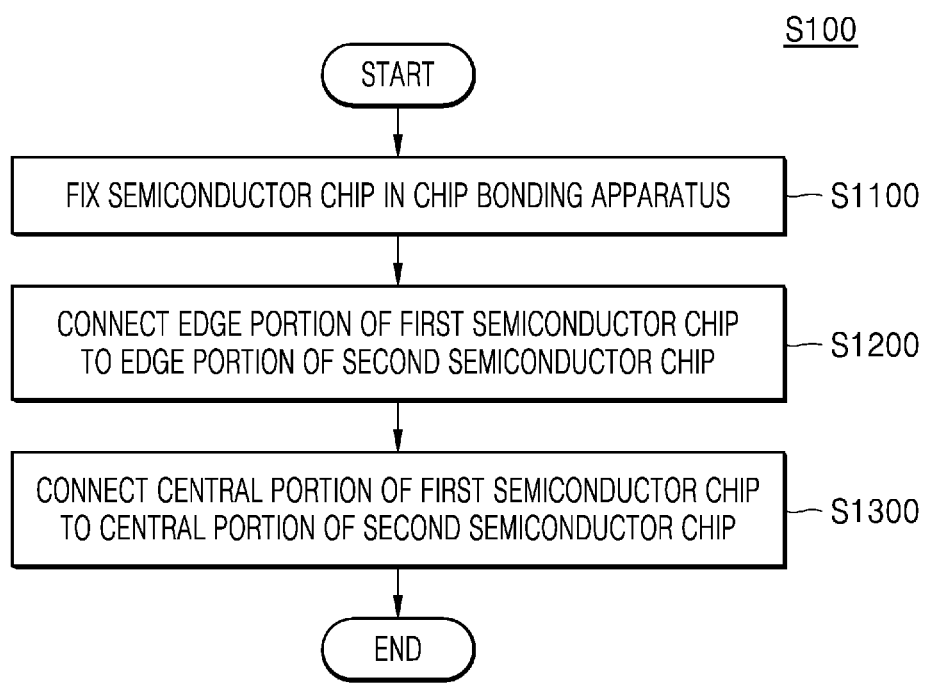
FIG. 6 is a flow chart illustrating a method of mounting a second semiconductor chip on a first semiconductor chip according to an example embodiment of the inventive concept.

FIG. 6 is a flow chart illustrating a flow of a method of mounting the second semiconductor chip 200 on the first semiconductor chip 100 according to an example embodiment of the inventive concept. In addition, FIGS. 7 to 10 are diagrams illustrating steps of mounting the second semiconductor chip 200 on the first semiconductor chip 100 according to an example embodiment of the inventive concept.

Referring to FIG. 6, a method S100 of mounting the second semiconductor chip 200 on the first semiconductor chip 100 according to an example embodiment of the inventive concept may include step S1100 of fixing the semiconductor chip 200 in the chip bonding apparatus 1000, step S1200 of connecting an edge portion of the first semiconductor chip 100 to an edge portion of the second semiconductor chip 200, and step S1300 of connecting a central portion of the first semiconductor chip 100 to a central portion of the second semiconductor chip 200.

Figure 7:
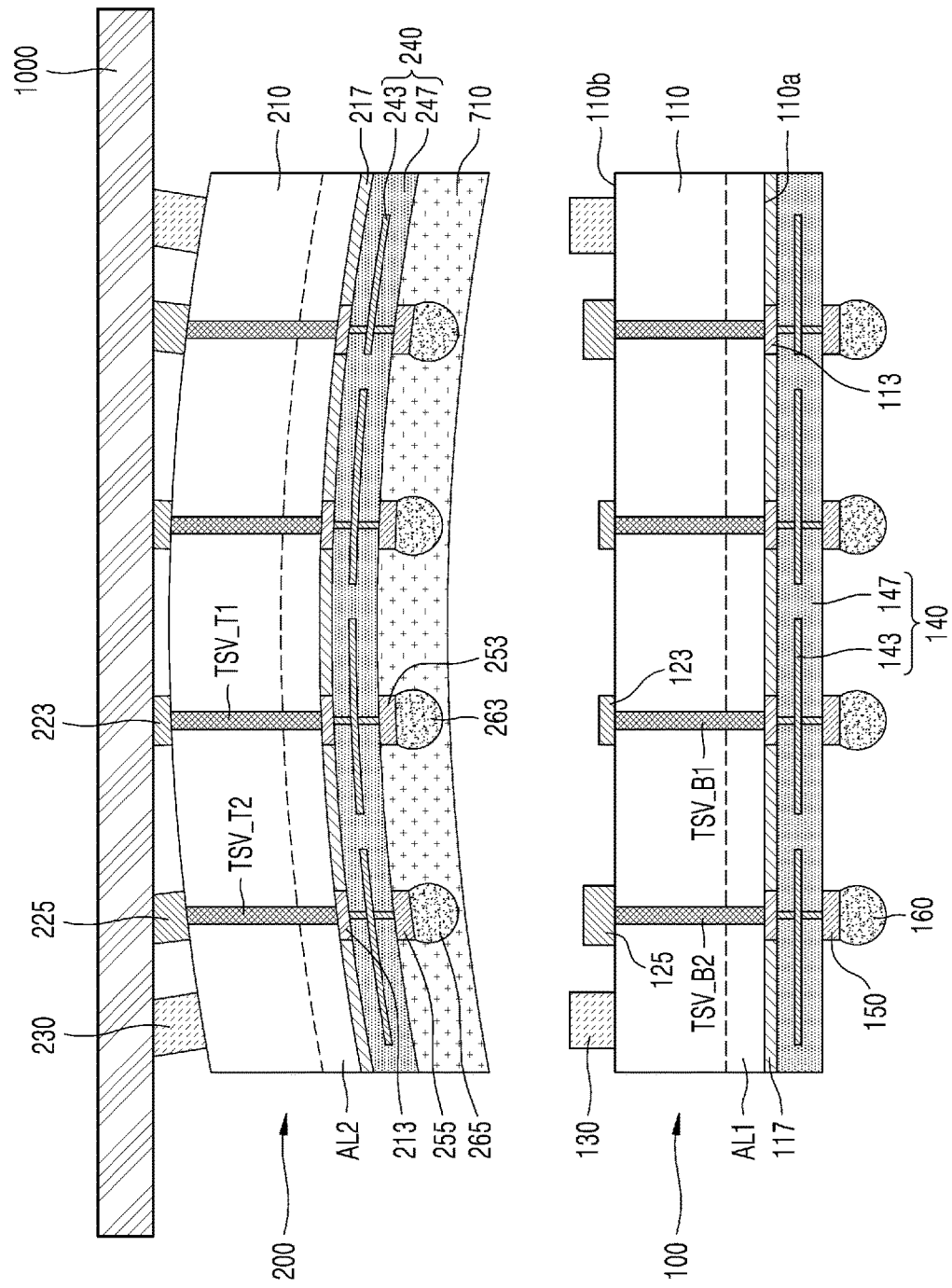
FIGS. 7 to 10 are diagrams illustrating steps of mounting a second semiconductor chip on a first semiconductor chip according to an example embodiment of the inventive concept.

Referring to FIGS. 6 and 7 together, in the step S1100 of fixing the second semiconductor chip 200 to the chip bonding apparatus 1000, the chip bonding apparatus 1000 may apply a vacuum pressure on the second semiconductor chip 200 to thereby fix the second semiconductor chip 200.

In the example embodiment, in the step S1100 of fixing the second semiconductor chip 200 to the chip bonding apparatus 1000, the first upper chip connection pad 223, the second upper chip connection pad 225, and the upper dummy pad 230 may be attached to a lower portion of the chip bonding apparatus 1000.

Since the height of the upper dummy pad 230 of the second semiconductor chip 200 is greater than the height of the second upper chip connection pad 225, and the height of the second upper chip connection pad 225 is greater than the height of the first upper chip connection pad 223, the second semiconductor chip 200 fixed to the chip bonding apparatus 1000 may be convexly bent upward (i.e., concave or concave downward).

Accordingly, in a state that the second semiconductor chip 200 is fixed to the chip bonding apparatus 1000, a lowermost portion of the second upper connection member 265 of the second semiconductor chip 200 may be at a lower level than a lowermost portion of the first upper connection member 263.

In addition, an uppermost portion of the second lower chip connection pad 125 of the first semiconductor chip 100 may be at a higher level than an uppermost portion of the first lower chip connection pad 123.

Figure 8:
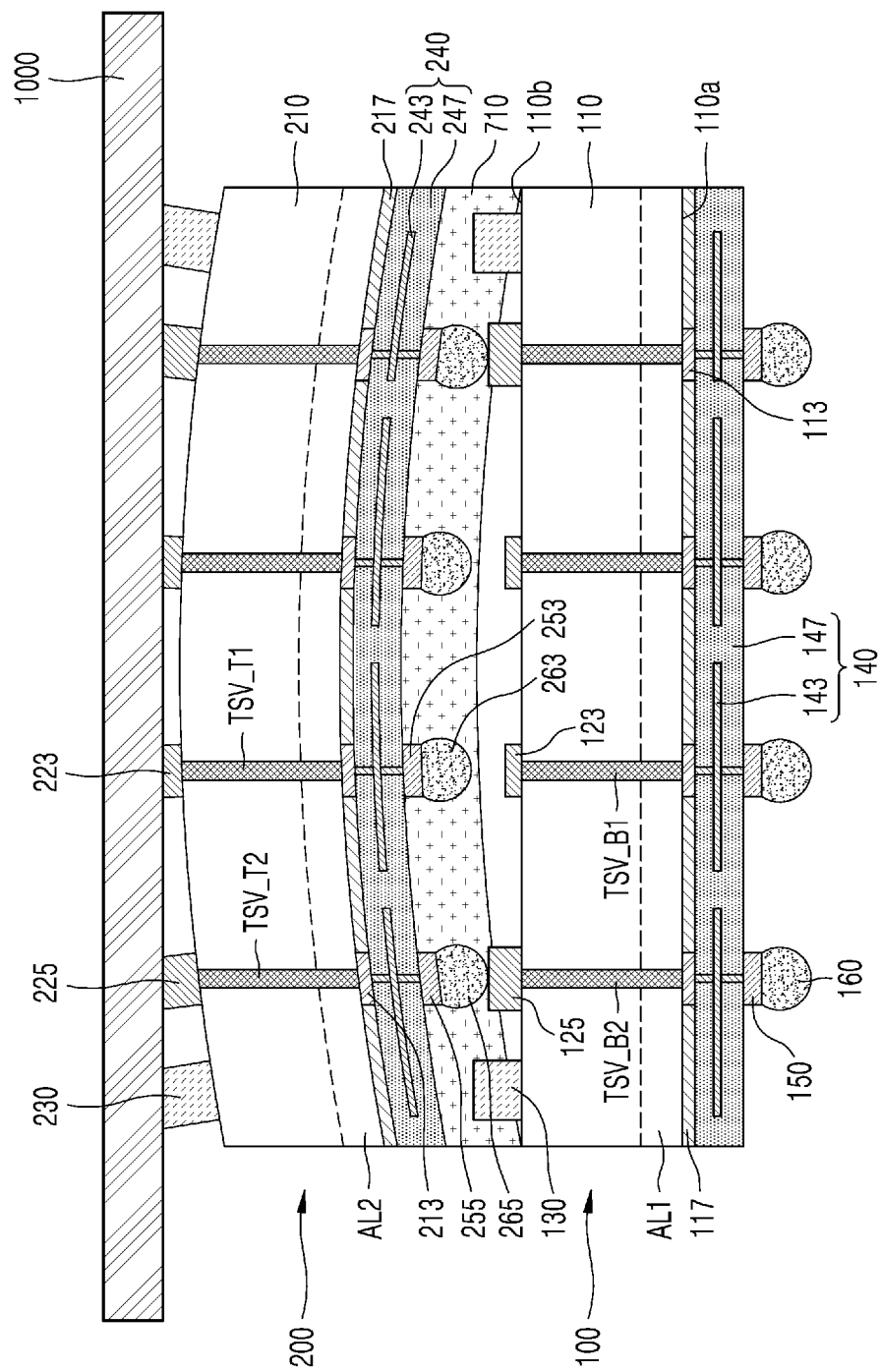

Referring to FIGS. 6 and 8 together, in step S1200 of connecting the edge portion of the first semiconductor chip 100 to the edge portion of the second semiconductor chip 200, the chip bonding apparatus 1000 may apply downwardly external force on the semiconductor chip 200 and heat the semiconductor chip 200, to thereby connect the second lower chip connection pad 125 of the first semiconductor chip 100 to the second upper connection member 265 of the second semiconductor chip 200.

When the second lower chip connection pad 125 of the first semiconductor chip 100 and the second upper connection member 265 of the second semiconductor chip 200 begin to contact each other, the first lower chip connection pad 123 of the first semiconductor chip 100 and the first upper connection member 263 of the second semiconductor chip 200 may be spaced apart from each other in the vertical direction.

Accordingly, the second lower chip connection pad 125 of the first semiconductor chip 100 and the second upper connection member 265 of the second semiconductor chip 200 may be connected to each other, before the first lower chip connection pad 123 of the first semiconductor chip 100 and the first upper connection member 263 of the second semiconductor chip 200 are connected to each other.

In a step in which the second lower chip connection pad 125 of the first semiconductor chip 100 and the second upper connection member 265 of the second semiconductor chip 200 are connected to each other, the second upper connection member 265 may be melted before the first upper connection member 263 is melted and then may be combined with the second lower chip connection pad 125.

Further, in the step in which the second lower chip connection pad 125 of the first semiconductor chip 100 and the second upper connection member 265 of the second semiconductor chip 200 are connected to each other, the edge portion of the adhesive layer 710 may be heated before the central portion thereof, and therefore the flowability at the edge portion of the adhesive layer 710 may be increased. Accordingly, the adhesion reliability of the edges of the first semiconductor chip 100 and the second semiconductor chip 200 may be improved.

Figure 9:
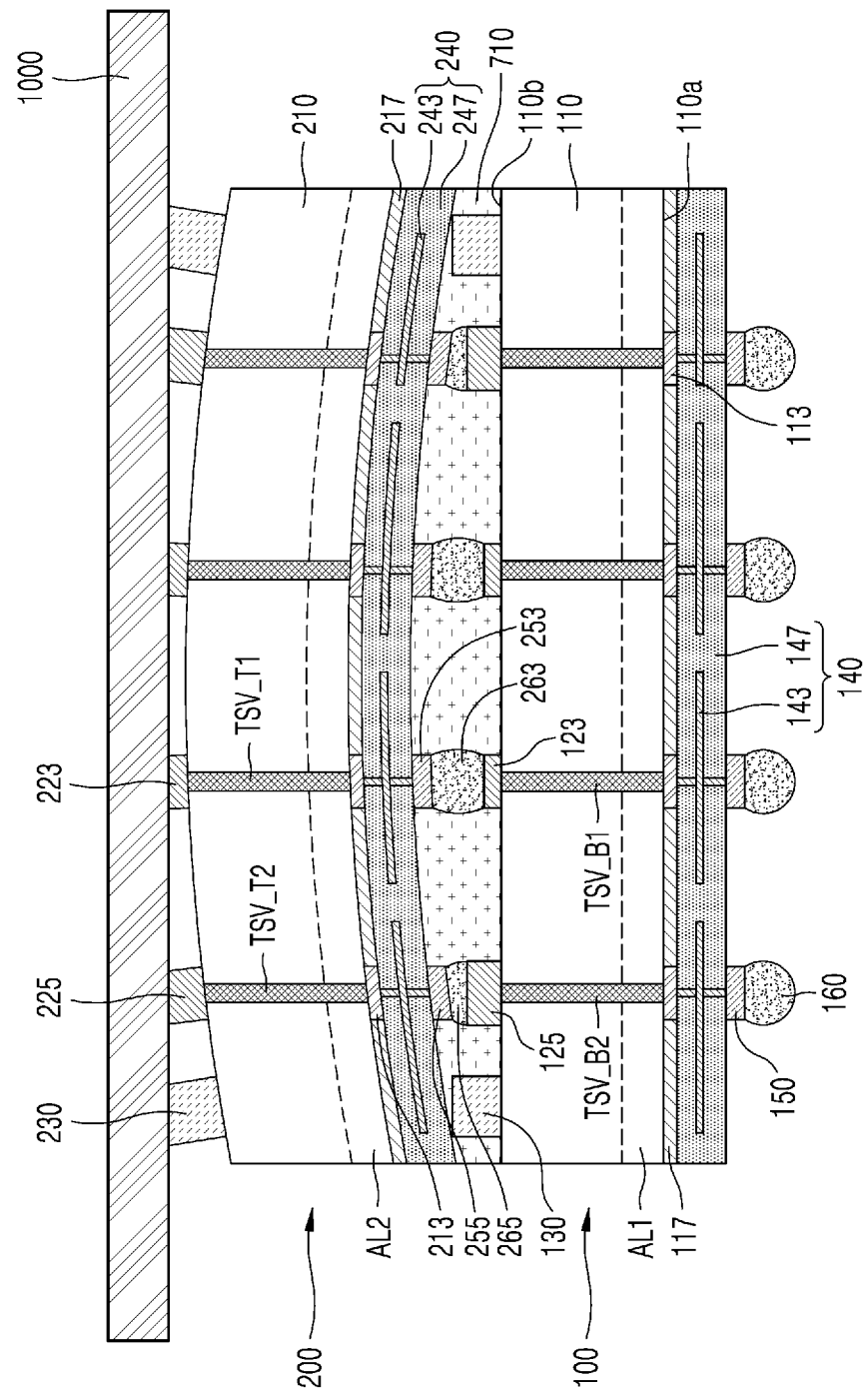

Referring to FIGS. 6 and 9 together, in the step S1300 of connecting the central portion of the first semiconductor chip 100 to the central portion of the second semiconductor chip 200, the chip bonding apparatus 1000 may apply downwardly external force on the semiconductor chip 200 and heat the semiconductor chip 200, to thereby connect the first lower chip connection pad 123 of the first semiconductor chip 100 to the first upper connection member 263 of the second semiconductor chip 200.

When the first lower chip connection pad 123 of the first semiconductor chip 100 and the first upper connection member 263 of the second semiconductor chip 200 begin to contact each other, the second lower chip connection pad 125 of first semiconductor chip 100 and the second upper connection member 265 of the second semiconductor chip 200 may be already connected.

Accordingly, the first lower chip connection pad 123 of the first semiconductor chip 100 and the first upper connection member 263 of the second semiconductor chip 200 may be connected to each other, after the second lower connection pad 125 of the first semiconductor chip 100 and the second upper connection member 265 of the second semiconductor chip 200 are connected to each other.

In a step in which the first lower chip connection pad 123 of the first semiconductor chip 100 and the first upper connection member 263 of the second semiconductor chip 200 are connected, the first upper connection member 263 may be melted and then may be combined with the first lower chip connection pad 123.

In the example embodiment, the second height h2 of the second chip connection pad 125 of the first semiconductor chip 100 may be about 1.1 times to about 2.5 times the first height h1 of the first chip connection pad 123.

When the second height h2 of the second chip connection pad 125 is less than 1.1 times the first height h1 of the first chip connection pad 123, in the step of connecting the second lower chip connecting the pad 125 of the first semiconductor chip 100 to the second upper connection member 265 of the second semiconductor chip 200, the edge of the adhesive layer 710 may not be sufficiently heated.

That is, when the second height h2 of the second chip connection pad 125 is less than 1.1 times the first height h1 of the first chip connection pad 123, since the first upper connection member 263 and the second upper connection member 265 are heated almost simultaneously, the flowability of the adhesive layer 710 at the edge thereof may be insufficient.

When the second height h2 of the second chip connection pad 125 is greater than 2.5 times the first height h1 of the first chip connection pad 123, since the warpage of the second semiconductor chip 200 may increase, the second semiconductor chip 200 may be physically damaged. In addition, when the second height h2 of the second chip connection pad 125 is greater than 2.5 times the first height h1 of the first chip connection pad 123, the adhesive property between the first lower chip connection pad 123 of the first semiconductor chip 100 and the first upper connection member 263 of the second semiconductor chip 200 may be weakened.

The second width d2 of the second lower chip connection pad 125 of the first semiconductor chip 100 may be greater than the first width d1 of the first lower chip connection pad 123. For example, the second width d2 of the second lower chip connection pad 125 may be about 1.1 times to about 1.5 times the first width d1 of the first lower chip connection pad 123.

When the second width d2 of the second lower chip connection pad 125 is less than 1.1 times the first width d1 of the first lower chip connection pad 123, since an area in which the second upper connection member 265 and the second lower chip connection pad 125 contact each other decreases, the adhesion reliability of the second upper connection member 265 and the second lower chip connection pad 125 may be reduced.

In addition, when the second width d2 of the second lower chip connection pad 125 is greater than 1.5 times the first width d1 of the first lower chip connection pad 123, due to a decrease in the height of the second upper connection member 265 formed on the second lower chip connection pad 125, the adhesion reliability between the second upper connection member 265 and the second lower chip connection pad 125 may be reduced.

Compared to the method of mounting the second semiconductor chip 200' on the first semiconductor chip 100' according to the comparative example, the method S100 of mounting the second semiconductor chip 200 on the first semiconductor chip 100 according to an example embodiment of the inventive concept may increase the flowability of the adhesive layer 710 at the edge thereof, so that the adhesion reliability of the edges of the first semiconductor chip 100 and the second semiconductor chip 200 may be improved.

Figure 10:
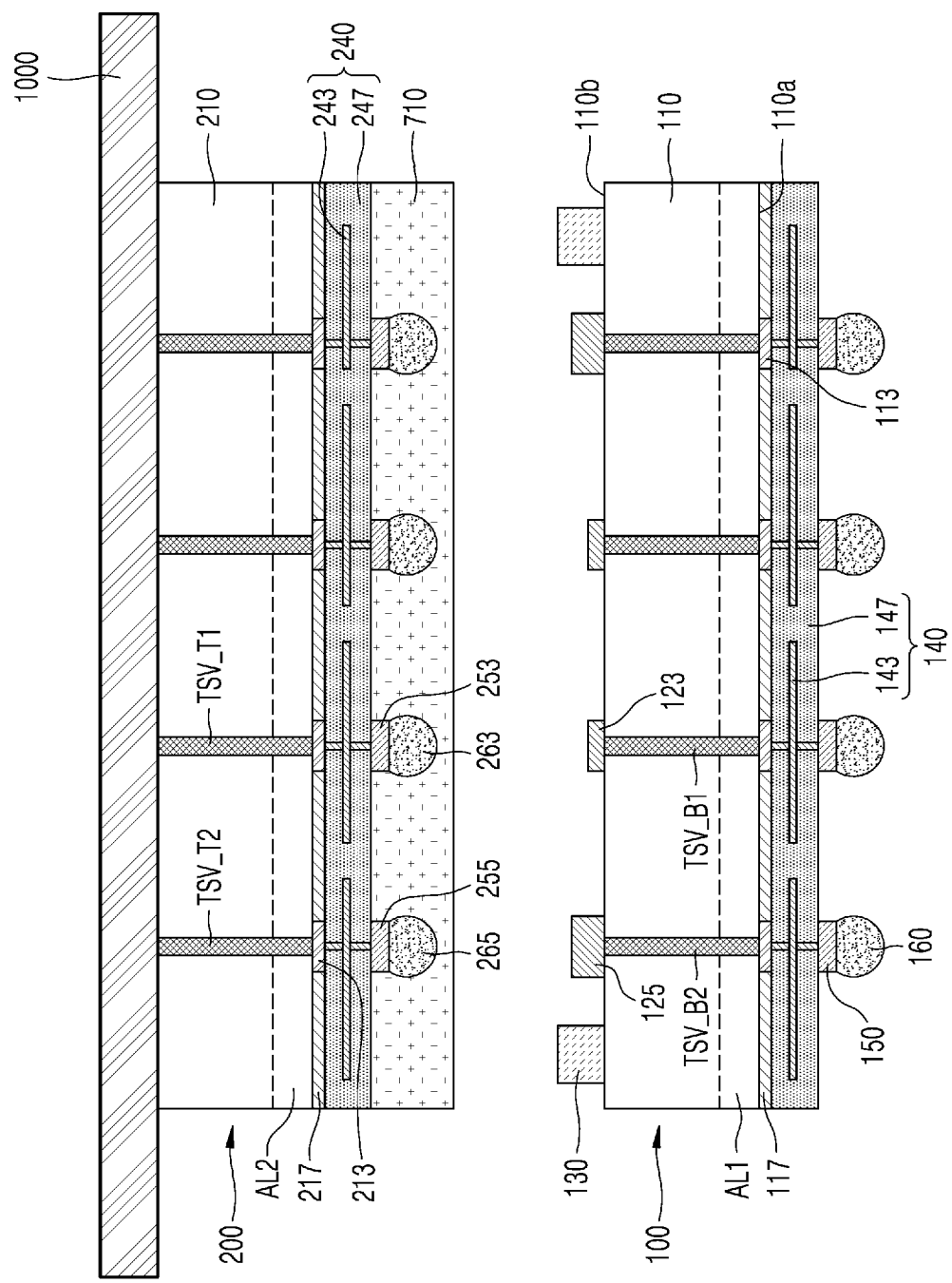

In addition, referring to FIG. 10, the second semiconductor chip 200 may not include the upper dummy pad 230, the first upper chip connection pad 223, and the second upper chip connection pad 225. Accordingly, the second semiconductor chip 200 fixed to the chip bonding apparatus 1000 may have a flat shape.

When the second semiconductor chip 200 is fixed to the chip bonding apparatus 1000, the uppermost portion of the second lower chip connection pad 125 of the first semiconductor chip 100 may be at a higher level than the uppermost portion of the first lower chip connection pad 123.

Accordingly, the second lower chip connection pad 125 of the first semiconductor chip 100 and the second upper connection member 265 of the second semiconductor chip 200 may be connected to each other, before the first lower chip connection pad 123 of the first semiconductor chip 100 and the first upper connection member 263 of the second semiconductor chip 200 are connected to each other.

In the step in which the second lower chip connection pad 125 of the first semiconductor chip 100 and the second upper connection member 265 of the second semiconductor chip 200 are connected to each other, the edge portion of the adhesive layer 710 may be heated before the central portion thereof, and therefore the flowability of the adhesive layer 710 at the edge portion thereof may be increased. Accordingly, the adhesion reliability at the edges of the first semiconductor chip 100 and the second semiconductor chip 200 may be improved.

Figure 11:
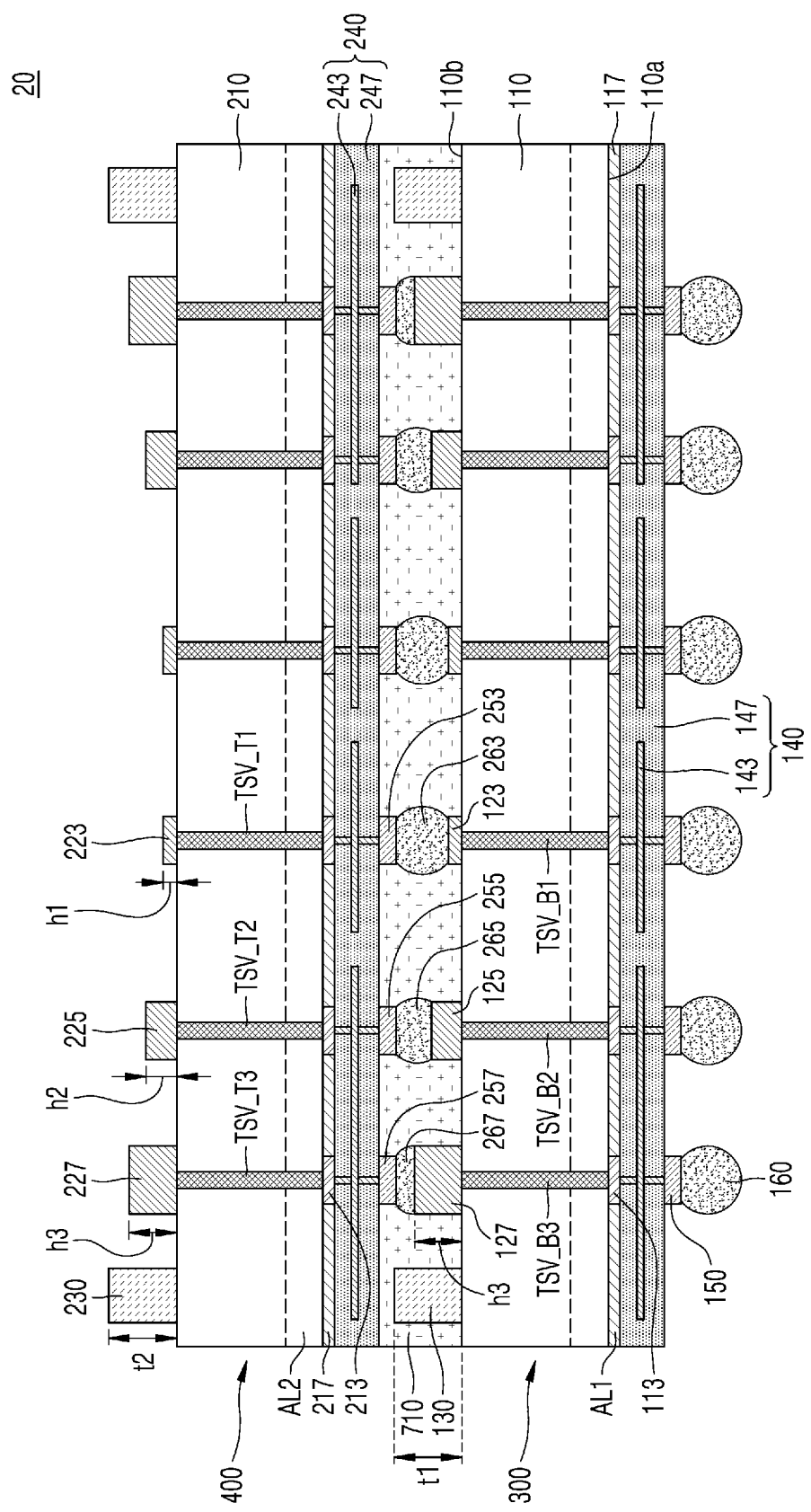
FIG. 11 is a cross-sectional view of a second semiconductor device according to an example embodiment of the inventive concept.

FIG. 11 is a cross-sectional view of a second semiconductor device 20 according to an example embodiment of the inventive concept. Hereinafter, descriptions of the first semiconductor device 10 of FIG. 3 will be omitted, and differences between the first semiconductor device 10 and the second semiconductor device 20 will be mainly described.

Referring to FIG. 11, a third semiconductor chip 300 of the second semiconductor device 20 may further include a third lower through electrode TSV_B3 that penetrates at least a portion of the first semiconductor substrate 110 in the vertical direction outside of the second lower through electrode TSV_B2.

The third semiconductor chip 300 may further include a third lower chip connection pad 127 on the second surface 110b of the first semiconductor substrate 110 so as to contact the third lower through electrode TSV_B3. In addition, the third lower chip connection pad 127 may be located inside the lower dummy pad 130 and outside the second lower chip connection pad 125. That is, the third lower chip connection pad 127 may be provided at a smaller radial location from the center of the first semiconductor substrate 110 than the lower dummy pad 130. In addition, the third lower chip connection pad 127 may be provided at a greater radial location from the center of the first semiconductor substrate 110 than the second lower chip connection pad 125. As a result, the third lower chip connection pad 127 may be provided farther from the edge of the first semiconductor substrate 110 than the lower dummy pad 130, but is provided closer to the edge of the first semiconductor substrate 110 than the second lower chip connection pad 125.

In the example embodiment, the height t1 of the lower dummy pad 130 may be greater than a height h3 of the third lower chip connection pad 127, and the height h3 of the third lower chip connection pad 127 may be greater than the height h2 of the second lower chip connection pad 125, and the height h2 of the second lower chip connection pad 125 may be greater than the height h1 of the first lower chip connection pad 123.

In addition, a fourth semiconductor chip 400 mounted on the third semiconductor chip 300 may further include a third upper through electrode TSV_T3 that penetrates at least a portion of the second semiconductor substrate 210 in the vertical direction outside of the second upper through electrode TSV_T2. That is, the third upper through electrode TSV_T3 may be provided at a greater radial location from the center of the second semiconductor substrate 210 than the second upper through electrode TSV_T2. As a result, the third upper through electrode TSV_T3 may be provided closer to the edge of the second semiconductor substrate 210 than the second upper through electrode TSV_T2.

The fourth semiconductor chip 400 may further include a third upper chip connection pad 227 on the second semiconductor substrate 210 so as to contact the third upper through electrode TSV_T3. In addition, the third upper chip connection pad 227 may be located inside the upper dummy pad 230 and outside the second upper chip connection pad 225. That is, the third upper chip connection pad 227 may be provided at a smaller radial location from the center of the semiconductor substrate 210 than the upper dummy pad 230. In addition, the third upper chip connection pad 227 may be provided at a greater radial location from the center of the semiconductor substrate 210 than the second upper chip connection pad 225. As a result, the third upper chip connection pad 227 may be provided farther from the edge of the semiconductor substrate 210 than the upper dummy pad 230, but is provided closer to the edge of the semiconductor substrate 210 than the second upper chip connection pad 225.

In the example embodiment, the height t2 of the upper dummy pad 230 may be greater than a height h3 of the third upper chip connection pad 227, the height h3 of the third upper chip connection pad 227 may be greater than the height h2 of the second upper chip connection pad 225, and the height h2 of the second upper chip connection pad 225 may be greater than the height h1 of the first upper chip connection pad 223.

In an example embodiment, the fourth semiconductor chip 400 may include a third upper bump pad 257 corresponding to the third lower chip connection pad 127 of the third semiconductor chip 300, and a third upper chip connection pad 267 between the third lower chip connection pad 127 and the third upper bump pad 257.

In the second semiconductor device 20 according to an example embodiment of the inventive concept, in a step of mounting the fourth semiconductor chip 400 on the third semiconductor chip 300, the flowability of the adhesive layer 710 at the edge thereof may be increased. Accordingly, the adhesion reliability at the edges of the third semiconductor chip 300 and the fourth semiconductor chip 400 may be improved.

Figure 12:
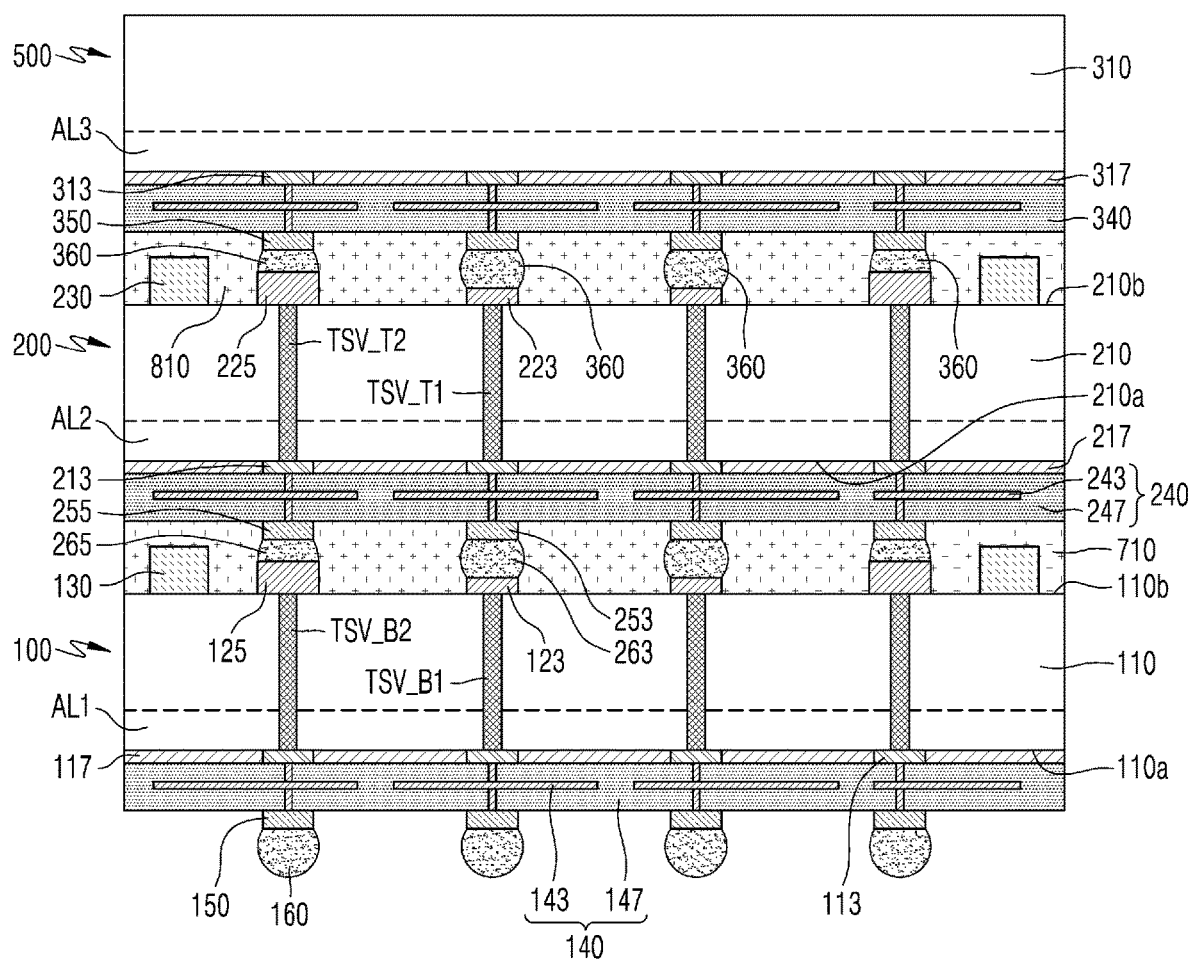
FIG. 12 is a cross-sectional view of a third semiconductor device according to an example embodiment of the inventive concept.

FIG. 12 is a cross-sectional view of a third semiconductor device 30 according to an example embodiment of the inventive concept. Hereinafter, descriptions of the first semiconductor device 10 of FIG. 3 will be omitted, and differences between the first semiconductor device 10 and the third semiconductor device 30 will be mainly described.

Referring to FIG. 12, the third semiconductor device 30 may further include an uppermost semiconductor chip 500 mounted on the second semiconductor chip 200. The uppermost semiconductor chip 500 may be a semiconductor chip provided at an uppermost portion of the third semiconductor device 30 including a plurality of semiconductor chips.

The uppermost semiconductor chip 500 may include a third semiconductor substrate 310, an uppermost chip pad 313, an uppermost passivation layer 317, an uppermost redistribution structure 340, an uppermost bump pad 350, and an uppermost connection member 360. Since descriptions on components of the uppermost semiconductor chip 500 may overlap with the above descriptions, detailed descriptions thereof will be omitted.

In an example embodiment, the uppermost semiconductor chip 500 may not include a through electrode. The active layer AL3 of the third semiconductor substrate 310 of the uppermost semiconductor chip 500 may be formed in a region of the third semiconductor substrate 310 adjacent to the second semiconductor chip 200.

In addition, the third semiconductor device 30 may further include a second adhesive layer 810 between the second semiconductor chip 200 and the uppermost semiconductor chip 500.

In FIG. 12, the third semiconductor device 30 includes three semiconductor chips 100, 200, and 300, but the number of semiconductor chips included in the third semiconductor device 30 is not limited thereto. For example, the third semiconductor device 30 may include a structure in which four or more semiconductor chips are stacked.

Figure 13:
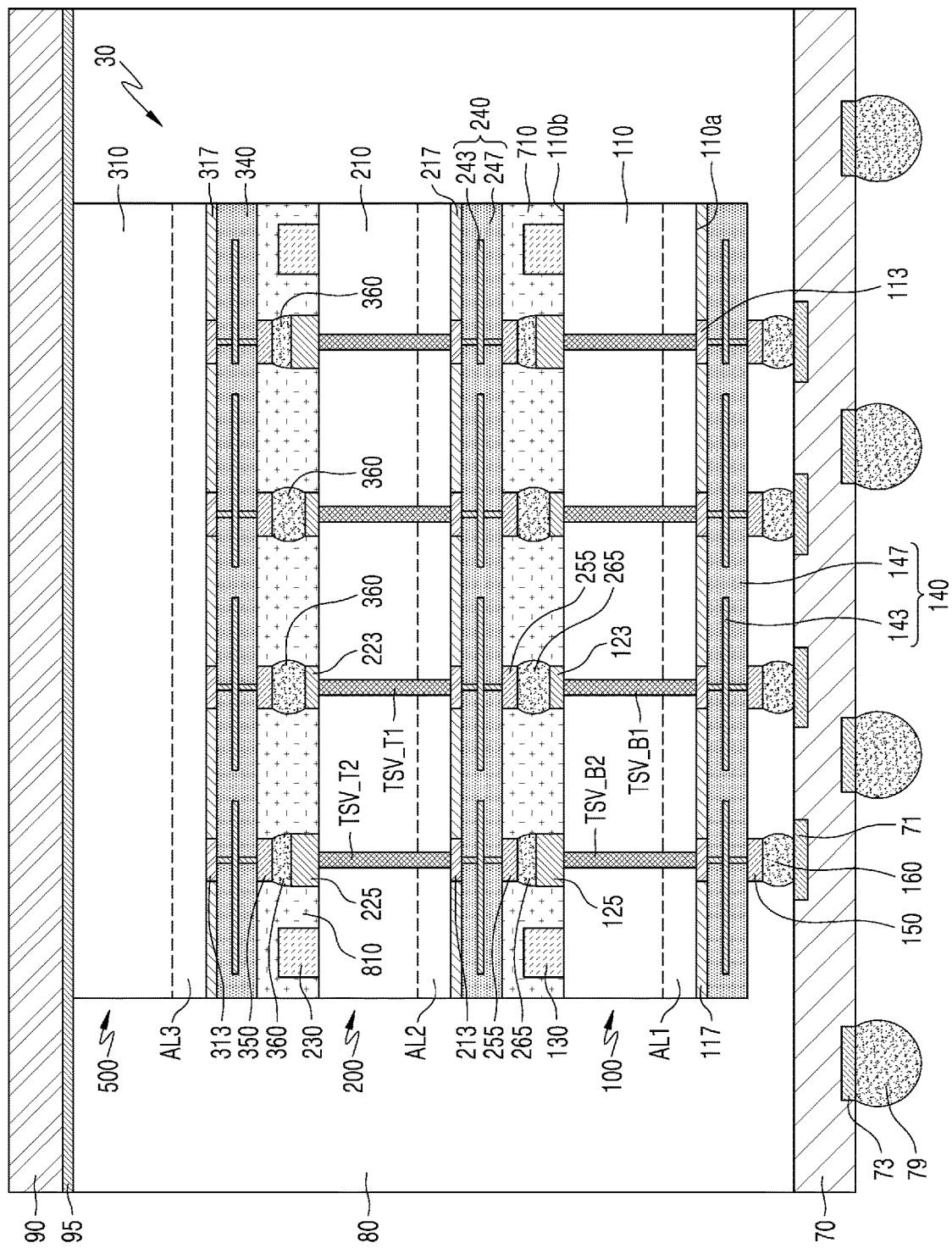
FIG. 13 is a cross-sectional view of a semiconductor package according to an example embodiment of the inventive concept.

FIG. 13 is a cross-sectional view of a semiconductor package 1 according to an example embodiment of the inventive concept.

Referring to FIG. 13, the semiconductor package 1 may include a third semiconductor device 30, a package substrate 70, a molding member 80, and a heat dissipating member 90. Since descriptions on the third semiconductor device 30 overlap contents described with reference to FIG. 12, detailed descriptions will be omitted.

In the example embodiment, the package substrate 70 may include a substrate for connecting the third semiconductor device 30 to an external device. An external connection terminal 79 may be attached to a second package substrate pad 73 of the package substrate 70. For example, the external connection terminal 79 may include a solder ball including a conductive material.

The package substrate 70 may include a double layer printed circuit board (PCB) including a first package substrate pad 71 and a second package substrate pad 73 on both sides thereof. However, the inventive concept is not limited to the above, and the package substrate 70 may include a single layer PCB including the first package substrate pad 71 on only one surface.

However, the inventive concept is not limited thereto, and the package substrate 70 is not limited to only a structure and material of the printed circuit board, and may include various types of substrates such as a ceramic substrate.

The third semiconductor device 30 may be mounted on the package substrate 70. More specifically, the third semiconductor device 30 may be mounted on the package substrate 70 so that the lower connection member 160 of the first semiconductor chip 100 contacts the first package substrate pad 71 of the package substrate 70.

The molding member 80 may surround at least a portion of the third semiconductor device 30 on the package substrate 70. In an example embodiment, the molding member 80 may include or may be formed of an epoxy molding compound (EMC). Of course, the molding member 80 is not limited to the epoxy molding compound, and may include or may be formed of various materials such as an epoxy-based material, a thermosetting material, a thermoplastic material, and a UV-treated material.

In the example embodiment, the molding member 80 may cover a side surface of the third semiconductor device 30 and not cover a top surface of the third semiconductor device 30. For example, the top surface of the molding member 80 may be on the same plane as the top surface of the third semiconductor device 30.

Since the top surface of the third semiconductor device 30 may be on the same plane as the top surface of the molding member 80, the heat dissipation performance of the semiconductor package 1 may be improved and simultaneously the size of the semiconductor package 1 may be reduced. However, the inventive concept is not limited to the above, and the molding member 80 may cover both the side surfaces and the top surface of the third semiconductor device 30.

The heat dissipating member 90 may be attached on the molding member 80 to externally dissipate heat generated from the third semiconductor device 30. In an example embodiment, the heat dissipating member 90 may include a heat slug or a heat sink. For example, the heat slug or the heat sink may have a concavo-convex shape in which concaveness and convexity are repeated in order to increase their surface area.

In an example embodiment, the heat dissipating member 90 may include or may be formed of at least one among a metal-based material, a ceramic-based material, a carbon-based material, and a polymer-based material, having excellent thermal conductivity. For example, the heat dissipating member 90 may include or may be formed of at least one metallic material among copper (Cu), aluminum (Al), magnesium (Mg), nickel (Ni), and silver (Ag), but is limited thereto.

In an example embodiment, an adhesive member 95 may be provided under the heat dissipating member 90. More specifically, the adhesive member 95 may be provided between a lower surface of the heat dissipating member 90 and the top surface of the molding member 80. For example, the adhesive member 95 may include or may be formed of a thermal interface material (TIM).

Figure 14:
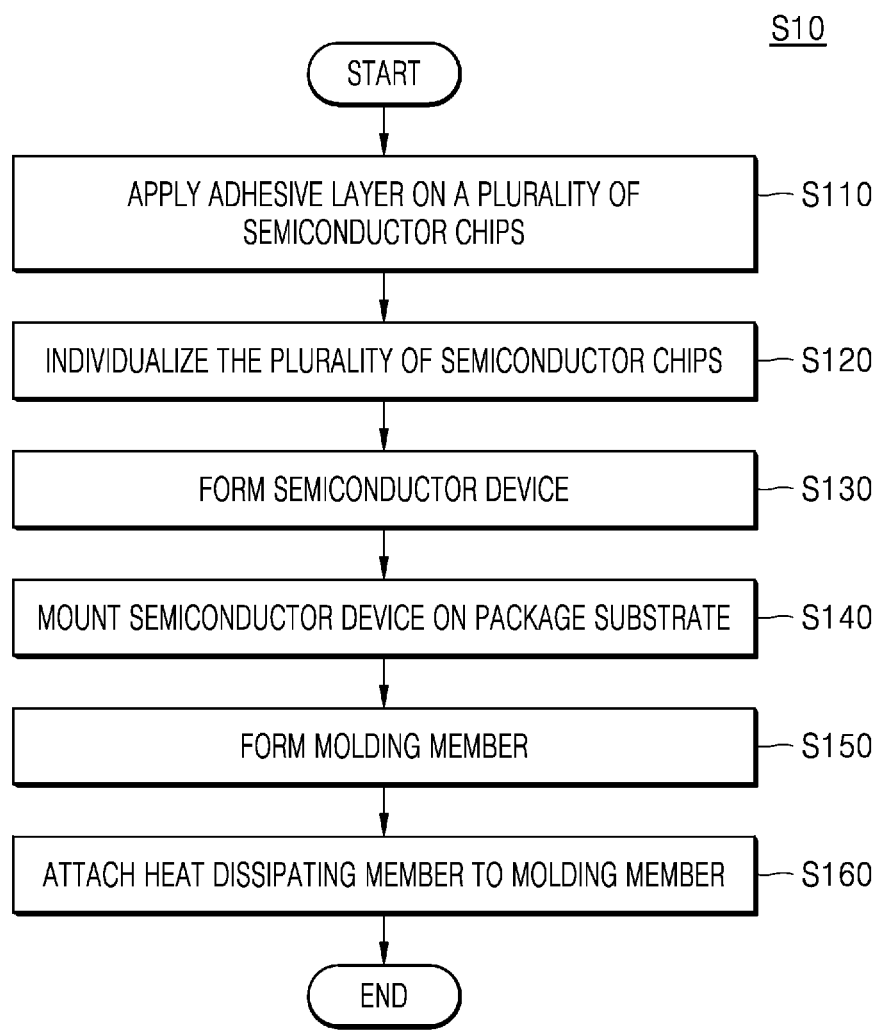
FIG. 14 is a flow chart illustrating a method of manufacturing a semiconductor package according to an example embodiment of the inventive concept.

FIG. 14 is a flow chart illustrating a flow of a method S10 of manufacturing a semiconductor package 1 according to an example embodiment of the inventive concept. In addition, FIGS. 15 to 21 are diagrams illustrating steps of a method of manufacturing a semiconductor package 1 according to an example embodiment of the inventive concept.

Figure 15:
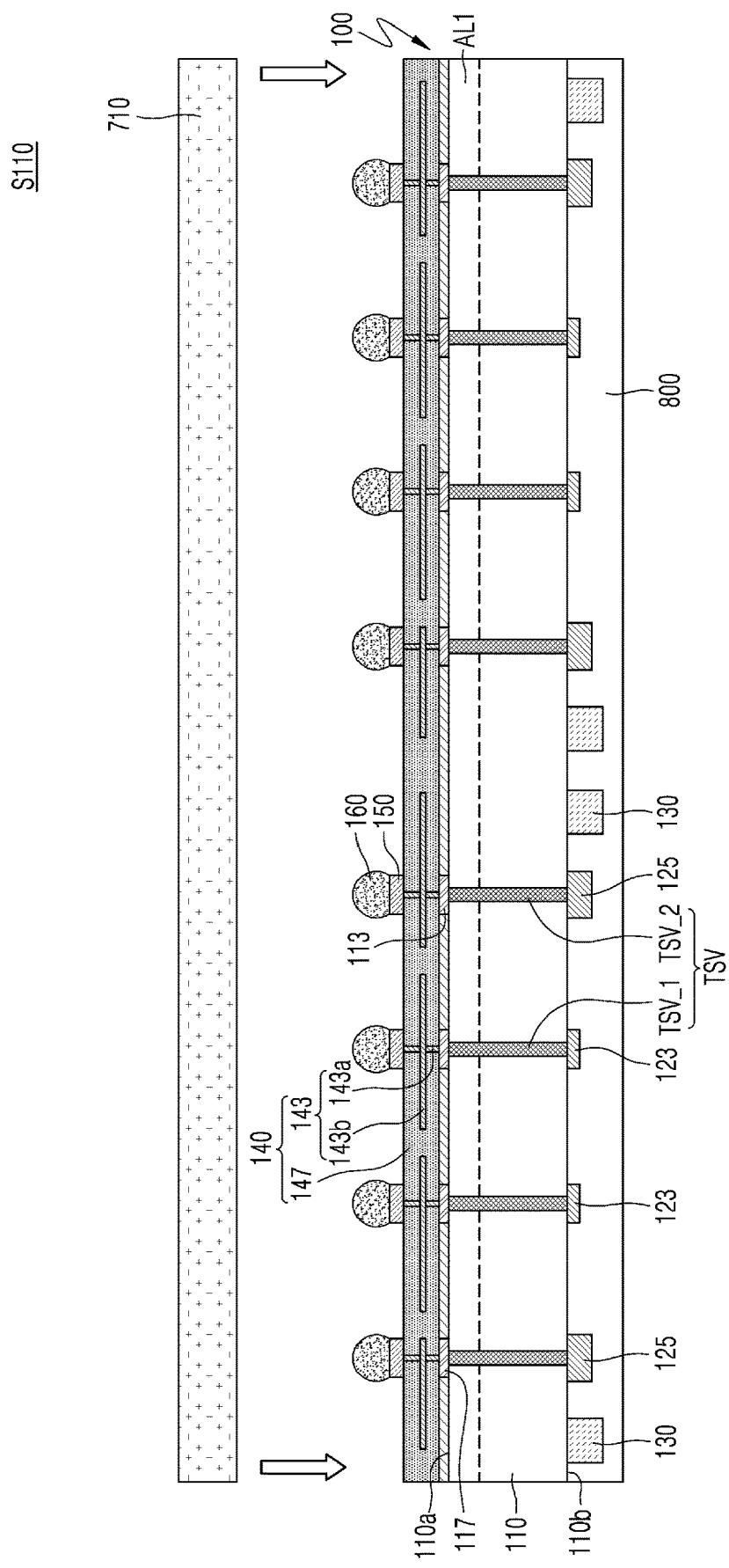
FIGS. 15 to 21 are diagrams illustrating steps of a method of manufacturing a semiconductor package according to an example embodiment of the inventive concept.

Referring to FIGS. 14 and 15, the method S10 of manufacturing the semiconductor package 1 according to an example embodiment of the inventive concept may include step S110 of applying the adhesive layer 710 on a structure including a plurality of semiconductor chips 100.

The plurality of semiconductor chips 100 may be formed through a general photolithography process, an etching process, a baking process, a plating process, or the like. In the example embodiment, the plurality of semiconductor chips 100 may be formed at a wafer level or a panel level, so that the plurality of semiconductor chips 100 may be interconnected in the horizontal direction.

Before step S110 is performed, a step of attaching a carrier substrate 800 to the second surface 110b of the plurality of semiconductor chips 100 may be performed. The carrier substrate 800 may be stable during subsequent processes such as the baking process and the etching process. The carrier substrate 800 may prevent physical damages to be occurred to the plurality of semiconductor chips 100 in the subsequent processes.

In the example embodiment, when the carrier substrate 800 is to be separated and removed by laser ablation, a transparent substrate may be used as the carrier substrate 800. Optionally, when the carrier substrate 800 is subsequently to be separated and removed by heating, a heat-resistant substrate may be used as the carrier substrate 800.

In an example embodiment, the carrier substrate 800 may include a glass substrate. In another example embodiment, the carrier substrate 800 may include or may be formed of a heat-resistant organic polymer material such as polyimide (PI), polyetheretherketone (PEEK), polyethersulfone (PES), polyphenylene sulfide (PPS), but is not limited thereto.

In step S110, the adhesive layer 710 may completely cover the lower connection member 160 of the first semiconductor chip 100 on the lower redistribution structure 140.

The adhesive layer 710 may include a material whose flowability is changed by heat. Specifically, the adhesive layer 710 may include a material in which the flowability is increased when heat is transferred to the adhesive layer 710 and that the flowability is decreased when heat is released from the adhesive layer 710.

In an example embodiment, the adhesive layer 710 may include a non-conductive film (NCF). For example, the adhesive layer 710 may include a film including an insulating polymer.

Figure 16:
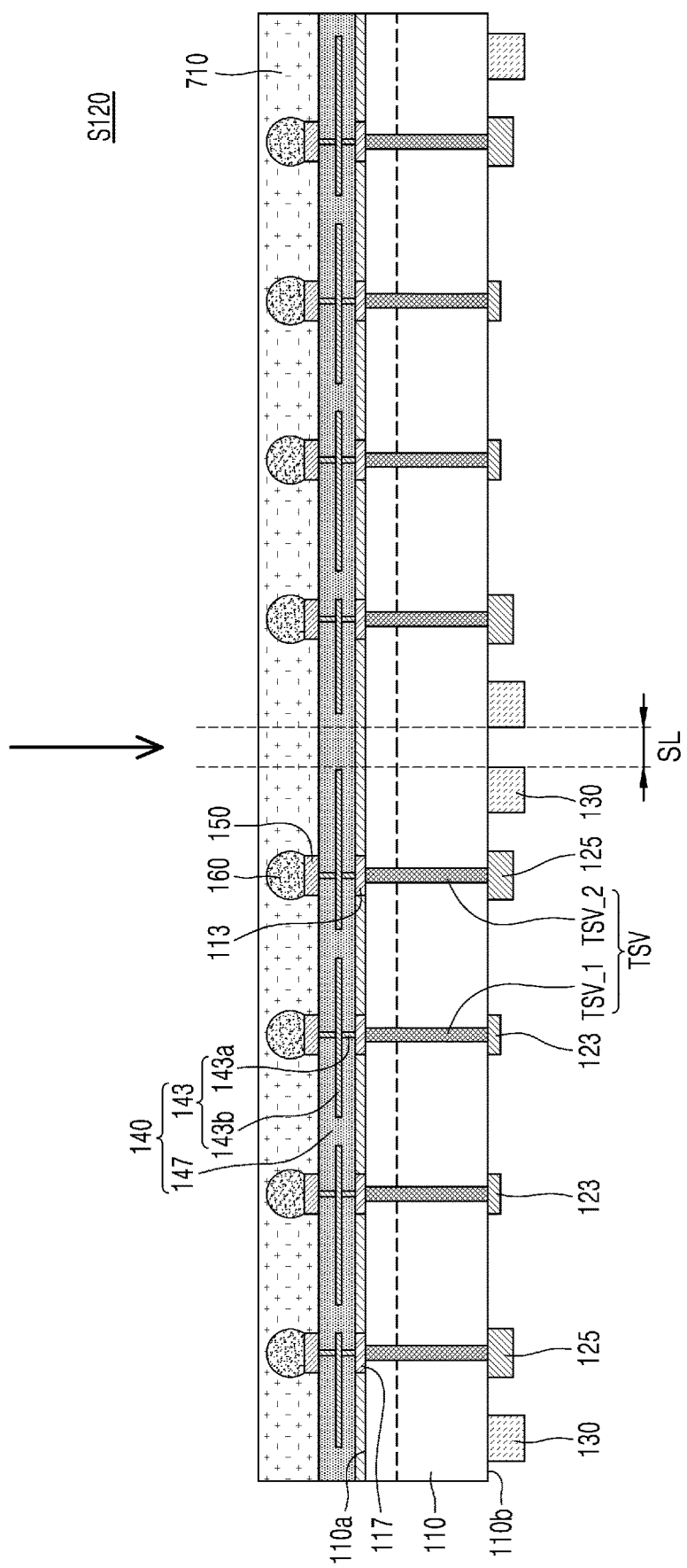

Referring to FIGS. 14 and 16, the method S10 of manufacturing the semiconductor package 1 according to an example embodiment of the inventive concept may include step S120 of individualizing the plurality of semiconductor chips 100.

Step S120 may be a step of individualizing the plurality of semiconductor chips 100, in which the plurality of semiconductor chips 100 included in the result of FIG. 15 may be individualized by being cut along a scribe lane SL in FIG. 16. In the example embodiment, step S120 of individualizing the plurality of semiconductor chips 100 may include cutting the scribe lane SL of FIG. 16 using a blade wheel.

The method is not limited to the above, and step S120 of individualizing the plurality of semiconductor chips 100 may include cutting the result of FIG. 15 using a laser. For example, step S120 of individualizing the plurality of semiconductor chips 100 may be a step of cutting the scribe lane SL by irradiating light emitted from the laser into the inside of the scribe lane of the result of FIG. 16.

Figure 17:
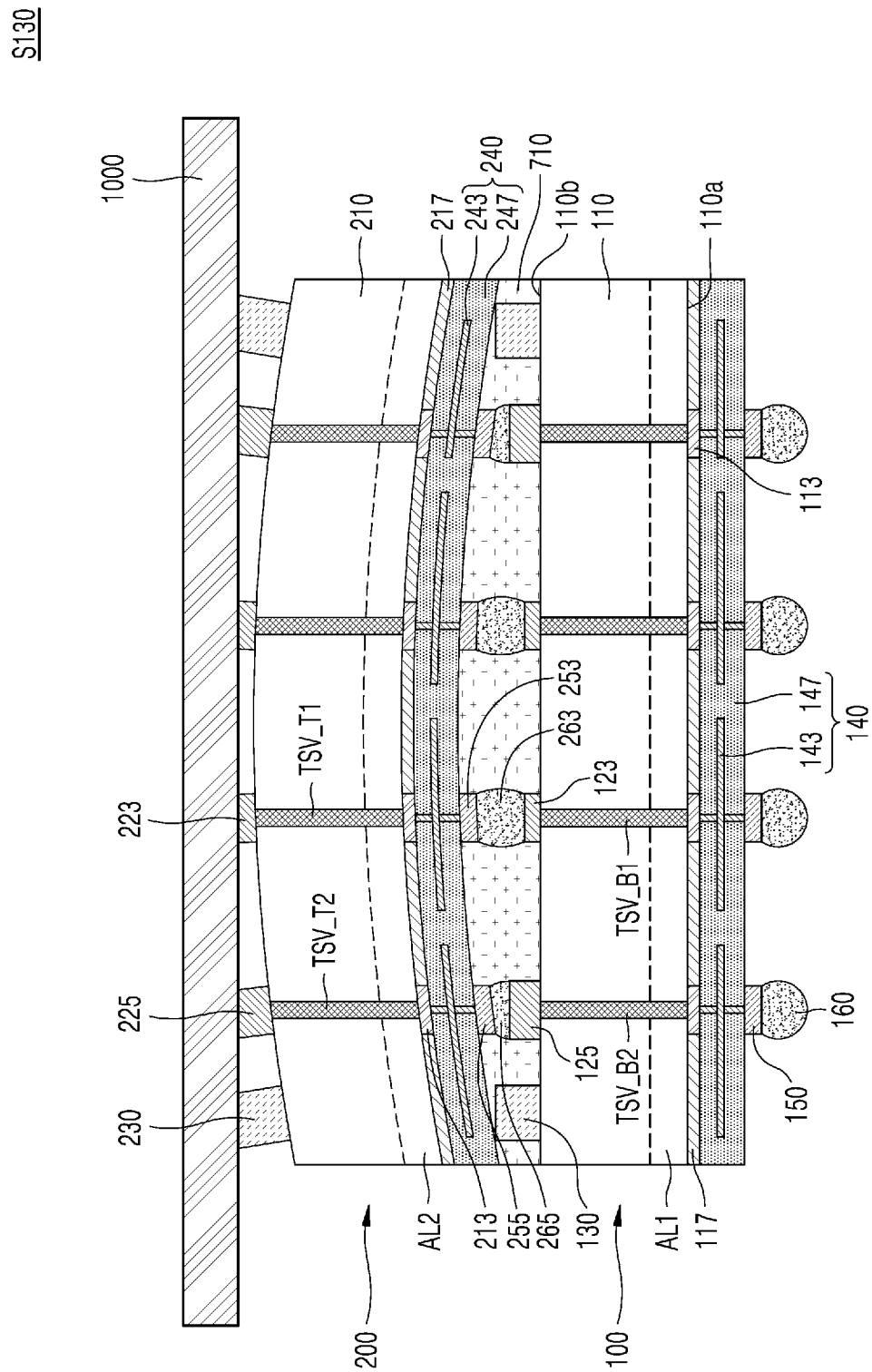
Figure 18:
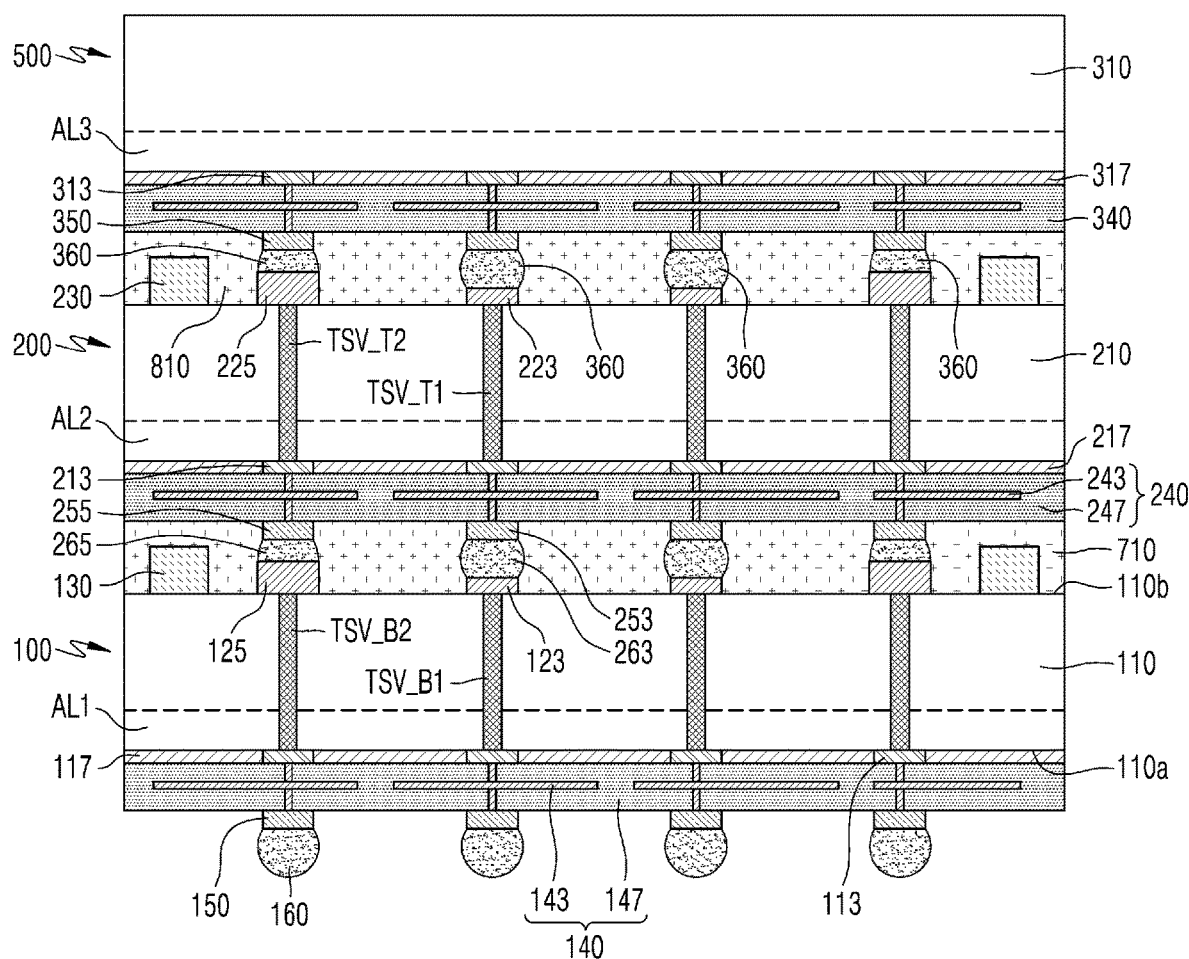

Referring to FIGS. 14, 17, and 18, the method S10 of manufacturing the semiconductor package 1 according to an example embodiment of the inventive concept may include step S130 of forming a semiconductor device 30.

Referring to FIG. 17, step S130 may include mounting the second semiconductor chip 200 on the first semiconductor chip 100 in the vertical direction using the chip bonding apparatus 1000. As described above, step S130 may be substantially the same as the method S100 of mounting the second semiconductor chip 200 on the first semiconductor chip 100 described with reference to FIGS. 6 to 10.

Step S130 may include step S1100 of fixing the second semiconductor chip 200, step S1200 of connecting the second lower chip connection pad 125 of the edge portion of the first semiconductor chip 100 to the second upper connection member 265 of the edge portion of the second semiconductor chip 200, and step S1300 of connecting the first lower chip connection pad 123 of the central portion of the first semiconductor chip 100 to the first upper connection member 263 of the central portion of the second semiconductor chip 200.

In step S130, the second lower chip connection pad 125 of the edge portion of the first semiconductor chip 100 and the second upper connection member 265 of the edge portion of the second semiconductor chip 200 may be connected to each other, before the first lower chip connection pad 123 of the central portion of the first semiconductor chip 100 and the first upper connection member 263 of the central portion of the second semiconductor chip 200 are connected to each other.

Accordingly, heat generated by the chip bonding apparatus 1000 may be first transferred to an edge portion of the adhesive layer 710. As heat generated by the chip bonding apparatus 1000 is first transferred to the edge portion of the adhesive layer 710, the flowability of the adhesive layer 710 at the edge portion may increase, so that adhesion reliability at the edge portions of the first semiconductor chip 100 and the second semiconductor chip 200 may be improved.

Figure 19:
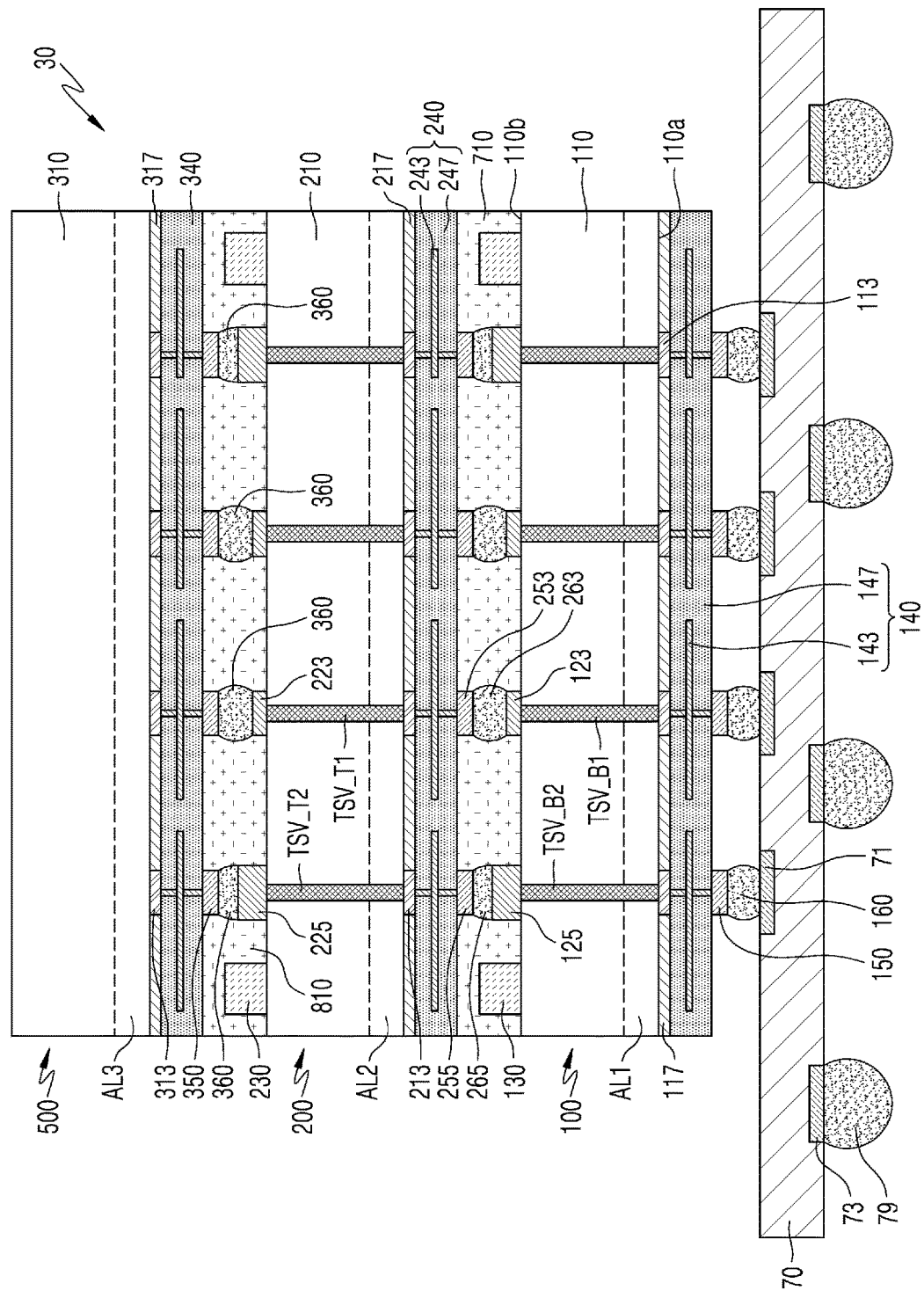

Referring to FIG. 19, step S130 may be a step of forming the semiconductor device 30 by stacking the plurality of semiconductor chips 100, 200, and 300 in the vertical direction. In an example embodiment, the semiconductor device 30 may include the third semiconductor device 30 of FIG. 12. Since descriptions on the third semiconductor device 30 overlap with contents described with reference to FIG. 12, detailed descriptions will be omitted.

Referring to FIGS. 14 and 19 together, the method S10 of manufacturing the semiconductor package 1 according to the example embodiment of the inventive concept may include step S140 of mounting the semiconductor device 30 on the package substrate 70.

In step S140, the third semiconductor device 30 may be mounted on the package substrate 70 so that the lower connection member 160 of the first semiconductor chip 100 contacts the first package substrate pad 71 of the package substrate 70.

Figure 20:
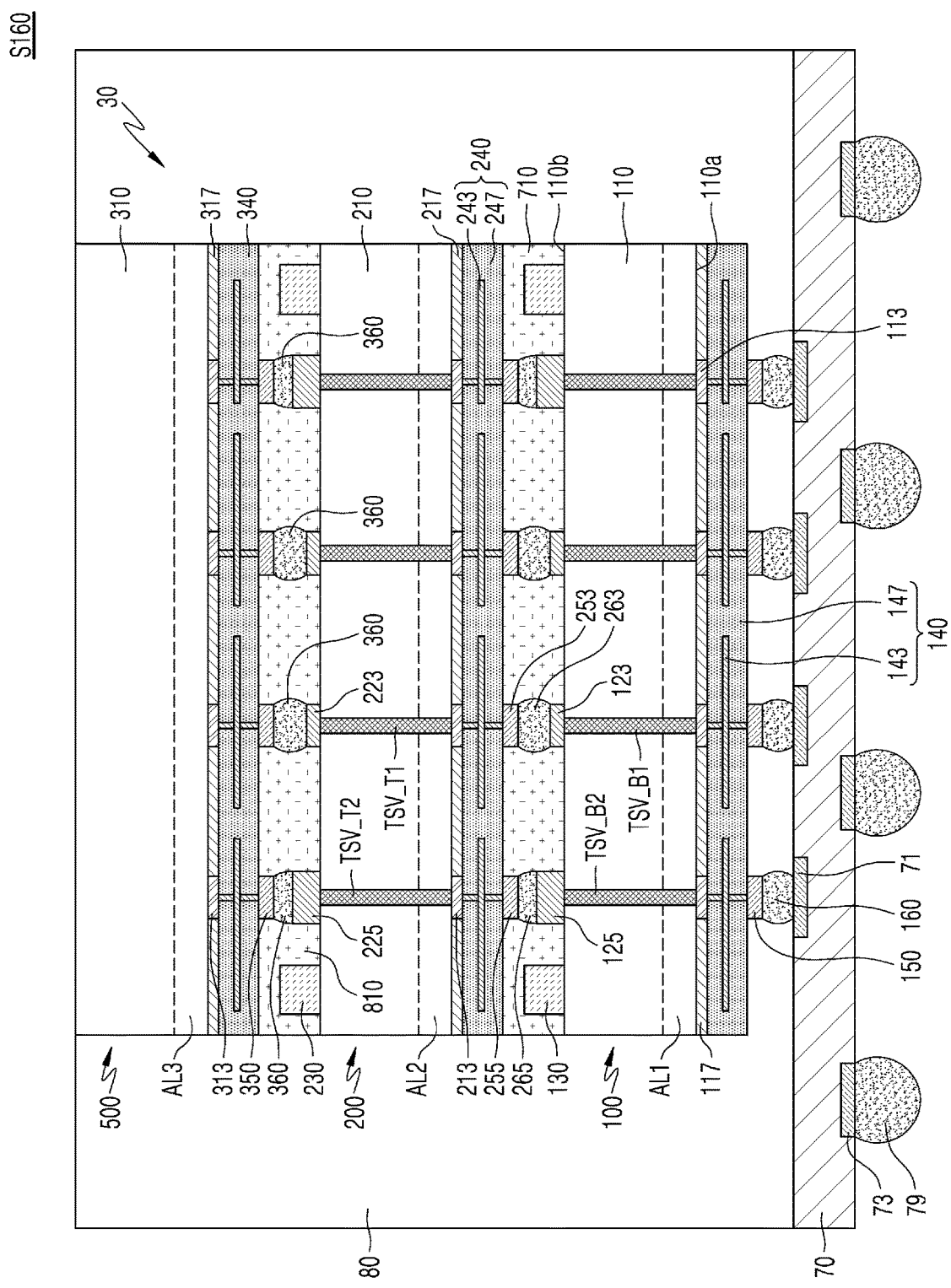

Referring to FIGS. 14 and 20 together, the method S10 of manufacturing the semiconductor package 1 according to the inventive concept may include step S150 of forming a molding member 80.

In an example embodiment, step S150 may include a step of forming the molding member 80 to cover both side surfaces and top surface of the third semiconductor device 30, and a step of removing a portion of an upper portion of the molding member 80 so that the top surface of the third semiconductor device 30 is exposed.

In an example embodiment, in a step of cutting the upper portion of the molding member 80, a portion of the upper portion of the molding member 80 may be removed so that the top surface of the molding member 80 and the top surface of the third semiconductor device 30 are at substantially the same level. For example, the upper portion of the molding member 80 may be removed through a grinding process.

However, the inventive concept is not limited to the above, and the molding member 80 may cover both the side surfaces and the top surface of the third semiconductor device 30.

Figure 21:
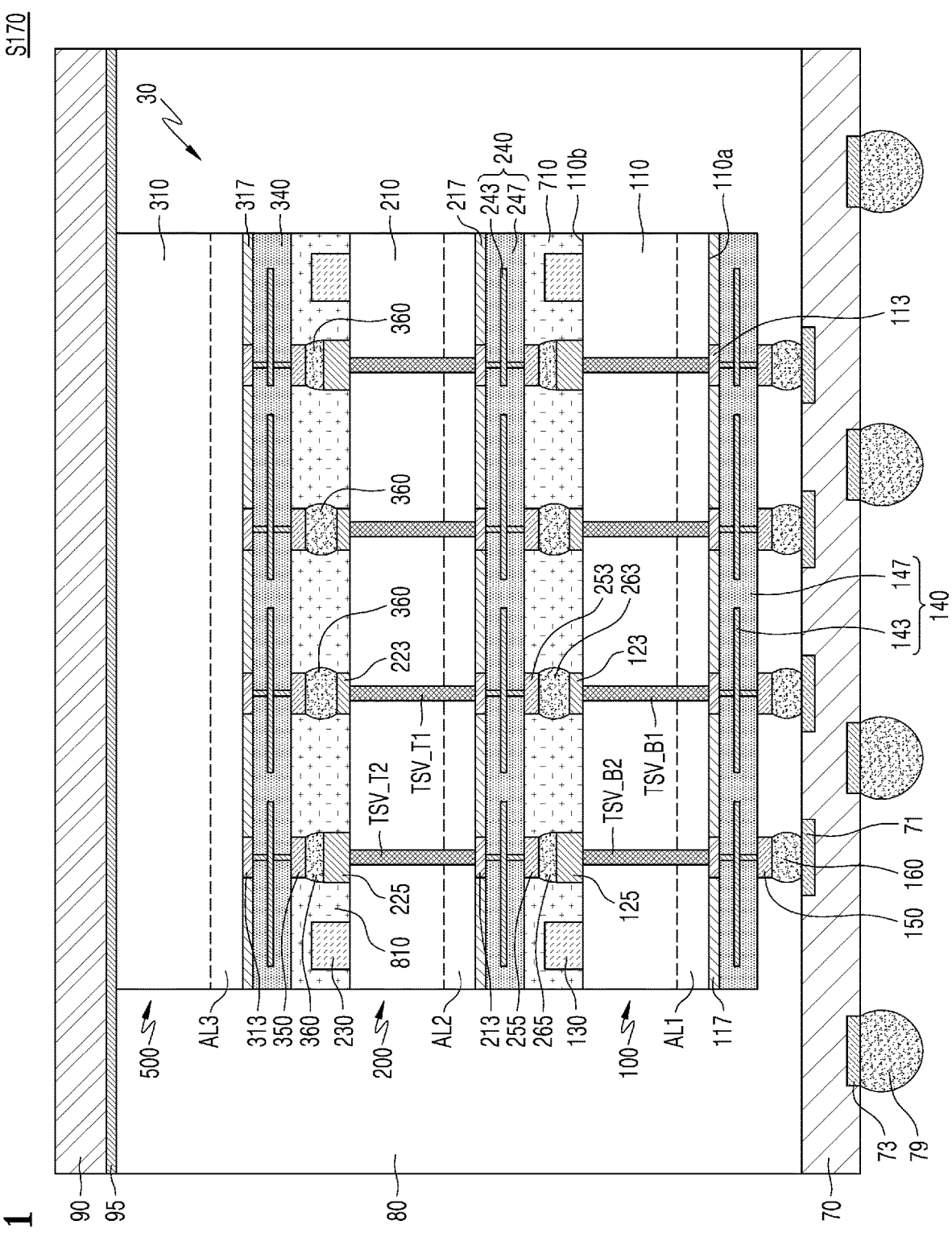

Referring to FIGS. 14 and 21 together, the method S10 of manufacturing the semiconductor package 1 according to the inventive concept may include step S160 of attaching the heat dissipating member 90 to the molding member 80.

Step S160 may be a step of attaching the heat dissipating member 90 such as the heat slug or the heat sink on the molding member 80. In an example embodiment, the heat slug or the heat sink may have the concavo-convex shape in which concaveness and convexity are repeated in order to increase their surface area.

In an example embodiment, the heat dissipating member 90 may be attached on the molding member 80 by the adhesive member 95 attached to the top surface of the molding member 80. For example, the adhesive member 95 may include the thermal interface material (TIM).

While the inventive concept has been particularly shown and described with reference to embodiments thereof, it will be understood that various changes in form and details may be made therein without departing from the spirit and scope of the following claims.

What is claimed is:

1. A semiconductor chip comprising:
    a semiconductor substrate having a first surface and a second surface opposite to the first surface, the semiconductor substrate comprising an active layer in a region adjacent to the first surface;
    a first through electrode penetrating at least a portion of the semiconductor substrate and connected to the active layer;
    a second through electrode located at a greater radial location from the center of the semiconductor substrate than the first through electrode, penetrating at least a portion of the semiconductor substrate, and connected to the active layer;
    a first chip connection pad having a first height and a first width, located on the second surface of the semiconductor substrate, and connected to the first through electrode; and
    a second chip connection pad having a second height greater than the first height and a second width greater than the first width, located on the second surface of the semiconductor substrate, and connected to the second through electrode.

2. The semiconductor chip of claim 1, wherein the second height of the second chip connection pad is 1.1 times to 2.5 times the first height of the first chip connection pad.

3. The semiconductor chip of claim 2, wherein the first height of the first chip connection pad is about 1 micrometer to about 20 micrometers.

4. The semiconductor chip of claim 1, wherein the second width of the second chip connection pad is 1.1 times to 1.5 times the first width of the first chip connection pad.

5. The semiconductor chip of claim 4, wherein the first width of the first chip connection pad is about 1 micrometer to about 30 micrometers.

6. The semiconductor chip of claim 1, further comprising a dummy pad arranged on the second surface of the semiconductor substrate and at a greater radial location from the center of the semiconductor substrate than the second chip connection pad, and having a third height greater than the second height of the second chip connection pad.

7. A semiconductor device comprising:
    a first semiconductor chip including
        a first semiconductor substrate having a first surface and a second surface opposite to the first surface and having a first active layer in a region adjacent to the first surface,
        a first lower through electrode penetrating at least a portion of the first semiconductor substrate and connected to the first active layer,
        a second lower through electrode located at a greater radial location from the center of the first semiconductor substrate than the first lower through electrode, penetrating at least a portion of the first semiconductor substrate, and connected to the first active layer,
        a first lower chip connection pad having a first height and a first width, located on the second surface of the first semiconductor substrate, and connected to the first lower through electrode, and
        a second lower chip connection pad having a second height greater than the first height and a second width greater than the first width, located on the second surface of the first semiconductor substrate, and connected to the second lower through electrode;
    a second semiconductor chip mounted on the first semiconductor chip, the second semiconductor chip including
        a second semiconductor substrate having a third surface and a fourth surface opposite to the third surface, a second active layer in a region adjacent to the third surface, and a redistribution structure on the third surface,
a first upper bump pad on the redistribution structure and coupled to the first lower chip connection pad of the first semiconductor chip,
a second upper bump pad on the redistribution structure and coupled to the second lower chip connection pad of the first semiconductor chip,
a first upper connection member provided between and in contact with the first upper bump pad and the first lower chip connection pad, and
a second upper connection member provided between and in contact with the second upper bump pad and the second lower chip connection pad; and
an adhesive layer provided between the first semiconductor chip and the second semiconductor chip, and surrounding the first upper bump pad, the second upper bump pad, the first lower chip connection pad, the second lower chip connection pad, the first upper connection member, and the second upper connection member.

8. The semiconductor device of claim 7, wherein the second height of the second lower chip connection pad is 1.1 times to 2.5 times the first height of the first lower chip connection pad, and
the second width of the second lower chip connection pad is 1.1 times to 1.5 times the first width of the first lower chip connection pad.

9. The semiconductor device of claim 8, wherein the first height of the first lower chip connection pad is about 1 micrometer to about 20 micrometers, and
the first width of the first lower chip connection pad is about 1 micrometer to about 30 micrometers.

10. The semiconductor device of claim 7, wherein a height of the first upper connection member is greater than a height of the second upper connection member.

11. The semiconductor device of claim 7, wherein an area of a lower surface of the first upper bump pad is the same as an area of a top surface of the first lower chip connection pad, and
an area of a lower surface of the second upper bump pad is less than an area of a top surface of the second lower chip connection pad.

12. The semiconductor device of claim 11, wherein the first upper connection member has a shape in which a horizontal cross-sectional area increases toward a central portion thereof in a vertical direction, and
the second upper connection member has a shape in which a horizontal cross-sectional area increases in a downward direction.

13. The semiconductor device of claim 12, wherein a sum of heights of the first lower chip connection pad, the first upper connection member, and the first upper bump pad is the same as a sum of heights of the second lower chip connection pad, the second upper connection member, and the second upper bump pad.

14. The semiconductor device of claim 7, wherein the second semiconductor chip further comprises:
a first upper through electrode penetrating at least a portion of the second semiconductor substrate and connected to the second active layer;
a second upper through electrode located at a greater radial location from the center of the second semiconductor substrate than the first upper through electrode, penetrating at least a portion of the second semiconductor substrate, and connected to the second active layer;
a first upper chip connection pad having a third height and a third width, located on the fourth surface of the second semiconductor substrate, and connected to the first upper through electrode; and
a second upper chip connection pad having a fourth height greater than the third height and a fourth width greater than the third width, located on the fourth surface of the second semiconductor substrate, and connected to the second upper through electrode.

15. A semiconductor package comprising:
a package substrate;
a first semiconductor chip mounted on the package substrate, the first semiconductor chip including
a first semiconductor substrate having a first surface and a second surface opposite to the first surface,
a first lower through electrode penetrating at least a portion of the first semiconductor substrate,
a second lower through electrode located at a greater radial location from the center of the first semiconductor substrate than the first lower through electrode and penetrating at least a portion of the first semiconductor substrate,
a first lower chip connection pad having a first height, located on the second surface of the first semiconductor substrate, and connected to the first lower through electrode and,
a second lower chip connection pad having a second height greater than the first height, located on the second surface of the first semiconductor substrate, and connected to the second lower through electrode, and
a lower redistribution structure on the first surface,
a second semiconductor chip mounted on the first semiconductor chip, the second semiconductor chip including
a second semiconductor substrate having a third surface and a fourth surface opposite to the third surface,
an upper redistribution structure on the third surface, a first upper bump pad on the upper redistribution structure and coupled to the first lower chip connection pad of the first semiconductor chip,
a second upper bump pad on the upper redistribution structure and coupled to the second lower chip connection pad of the first semiconductor chip, a first upper connection member provided between and in contact with the first upper bump pad and the first lower chip connection pad, and
a second upper connection member provided between and in contact with the second upper bump pad and the second lower chip connection pad, and
an adhesive layer provided between the first semiconductor chip and the second semiconductor chip, and surrounding the first upper bump pad, the second upper bump pad, the first lower chip connection pad, the second lower chip connection pad, the first upper connection member, and the second upper connection member; and
a molding member surrounding the first semiconductor chip and the second semiconductor chip on the package substrate.

16. The semiconductor package of claim 15, wherein the second height of the second lower chip connection pad is 1.1 times to 2.5 times the first height of the first lower chip connection pad.

17. The semiconductor package of claim 15, wherein the first semiconductor chip further comprises a dummy pad arranged on the second surface of the first semiconductor substrate and at a greater radial location from the center of the first semiconductor substrate than the second lower chip connection pad, and having a third height greater than the second height of the second lower chip connection pad.

18. The semiconductor package of claim 15, wherein an area of a lower surface of the first upper bump pad is the same as an area of a top surface of the first lower chip connection pad, and an area of a lower surface of the second upper bump pad is less than an area of a top surface of the second lower chip connection pad, and
    the first upper connection member has a shape in which a horizontal cross-sectional area increases toward a central portion thereof in a vertical direction and the second upper connection member has a shape in which a horizontal cross-sectional area increases toward a downward direction.

19. The semiconductor package of claim 15, wherein a sum of heights of the first lower chip connection pad, the first upper connection member, and the first upper bump pad is the same as a sum of heights of the second lower chip connection pad, the second upper connection member, and the second upper bump pad.

20. The semiconductor package of claim 15, further comprising a heat dissipating member attached to a top surface of the molding member.

* * * * *